(12) United States Patent
Takahashi et al.

(10) Patent No.: US 7,002,854 B2
(45) Date of Patent: Feb. 21, 2006

(54) INTERNAL VOLTAGE LEVEL CONTROL CIRCUIT AND SEMICONDUCTOR MEMORY DEVICE AS WELL AS METHOD OF CONTROLLING THE SAME

(75) Inventors: Hiroyuki Takahashi, Tokyo (JP); Atsushi Nakagawa, Tokyo (JP)

(73) Assignee: NEC Electronics Corp., Kanagawa (JP)

( * ) Notice: Subject to any disclaimer, the term of this patent is extended or adjusted under 35 U.S.C. 154(b) by 207 days.

(21) Appl. No.: 10/343,042

(22) PCT Filed: Jul. 24, 2001

(86) PCT No.: PCT/JP01/06374

§ 371 (c)(1),
(2), (4) Date: Jan. 27, 2003

(87) PCT Pub. No.: WO02/09119

PCT Pub. Date: Jan. 31, 2002

(65) Prior Publication Data

US 2004/0015640 A1   Jan. 22, 2004

(30) Foreign Application Priority Data

Jul. 25, 2000    (JP) .............................. 2000-224452

(51) Int. Cl.
*G11C 7/00* (2006.01)

(52) U.S. Cl. .................................. 365/189.09; 365/226

(58) Field of Classification Search ........... 365/189.09, 365/222, 226, 227

See application file for complete search history.

(56) References Cited

U.S. PATENT DOCUMENTS 5,594,699 A * 1/1997 Nomura et al. ............. 365/226

FOREIGN PATENT DOCUMENTS

JP           63-255897         10/1988

(Continued)

*Primary Examiner*—Son Mai
(74) *Attorney, Agent, or Firm*—Choate Hall & Stewart LLP

(57) ABSTRACT

There are provided a voltage level control circuit with a reduced power consumption and a method of controlling the same. When a signal "A" is in a "L" level and a signal PL entered from the outside of the voltage level control circuit becomes "H" level, a latch signal La outputted from a latch becomes "H" level, whereby NFETs turn ON. A voltage dividing circuit comprising resistances and current mirror differential amplifiers are placed in active states to output "H" as a signal A which controls a boost voltage Vbt (word line driving voltage). As the boost voltage Vbt is increased and reaches to a reference voltage Vref2, a voltage V2 becomes "H", whereby the signal A becomes "L". After the signal A become "L", the latch is made through. At this time, the signal PL is "L", the latch signal La outputted from the latch becomes "L", whereby the NFETs turn OFF. As described here, the NFETs is kept OFF in the other time period than when needed, in order to reduce the power consumption.

14 Claims, 16 Drawing Sheets

U.S. PATENT DOCUMENTS

| | | | |
|---|---|---|---|
| 5,805,508 A * | 9/1998 | Tobita | 365/189.09 |
| 5,994,888 A | 11/1999 | Yanagawa | |
| 6,058,061 A * | 5/2000 | Ooishi | 365/222 |
| 6,316,985 B1 | 11/2001 | Kobayashi et al. | |
| 6,452,854 B1 * | 9/2002 | Kato et al. | 365/226 |
| 6,487,136 B1 * | 11/2002 | Hidaka | 365/222 |

FOREIGN PATENT DOCUMENTS

| | | |
|---|---|---|
| JP | 6-14528 | 1/1994 |
| JP | 11-16368 | 1/1999 |
| JP | 11-66855 | 3/1999 |
| JP | 11-250662 | 9/1999 |
| JP | 2000-40360 | 2/2000 |
| JP | 2000-75940 | 3/2000 |
| JP | 2000-112547 | 4/2000 |

* cited by examiner

INTERNAL VOLTAGE LEVEL CONTROL CIRCUIT AND SEMICONDUCTOR MEMORY DEVICE AS WELL AS METHOD OF CONTROLLING THE SAME

TECHNICAL FIELD

The present invention relates to a voltage level control circuit and a method of controlling the same, and more particularly to a voltage level control circuit for controlling a level of an internal voltage to be used in a semiconductor memory device and other electronic circuits, and a method of controlling the same as well as a semiconductor device using this voltage level control circuit, particularly, a semiconductor memory device such as a pseudo SRAM which generates internally a refresh signal for refreshing memory cells.

BACKGROUND ART

Semiconductor circuits such as semiconductor memory devices have widely been used in various portable devices such as portable telephones. For the semiconductor circuits to be used for the portable devices, it is a great issue how to reduce the power consumption. Japanese laid-open patent publications Nos. 63-255897 and 11-16368 disclose prior arts for reducing the power consumption.

FIG. 1 is a block diagram showing a basic structure of a semiconductor memory device (DRAM: dynamic RAM) disclosed in Japanese laid-open patent publication No. 63-255897. The semiconductor memory device has a φWL generating circuit 152 for generating a word line driving signal φWL. The φL generating circuit 152 receives an external input of /RAS signal (/ means a negative logic signal and RAS means a row address strobe), and generates the word line driving signal φWL in accordance with the inputted /RAS signal. The semiconductor memory device also has a row decoder 155 which is connected to an output side of the φWL generating circuit 152 and receives an input of the word line driving signal φWL as outputted from the φWL generating circuit 152. The semiconductor memory device also has a φWL booster circuit 153 for boosting the word line driving signal φWL as well as a φWL comparator circuit 154. The φWL comparator circuit 154 receives an external input of a reference voltage Vref and is connected to an output side of the φWL generating circuit 152 for receiving the input of the word line driving signal φWL as outputted from the φWL generating circuit 152, whereby the φWL comparator circuit 154 compares the word line driving signal φWL and the reference voltage Vref and outputs a compared result signal S4 as a result of the comparison. Further, the φWL booster circuit 153 receives an input of the /RAS signal and is connected to an output side of the φWL comparator circuit 154 for receiving an input of the compared result signal S4, whereby the φWL booster circuit 153 boosts the word line driving signal φWL based on the /RAS signal and the compared result signal S4 from the φWL comparator circuit 154. The row decoder 155 supplies the word line driving signal φWL to a word line WL designated by the address signal.

Operations of the above circuit will be described based on the timing chart of FIG. 2. As the /RAS signal falls, the φWL generating circuit 152 upon receipt of this /RAS signal makes the word line driving signal φWL rise up to a power voltage level Vcc at a time "t1". At the same time, the φWL booster circuit 153 upon receipt of this /RAS signal makes the word line driving signal φWL boost up to a higher level than Vcc. At a time "t2" where the /RAS signal falls, the φWL comparator circuit 154 compares a level VWL of the word line driving signal φWL and the reference voltage Vref, and outputs the signal S4 which shows the comparison result, which is supplied to the φWL booster circuit 153. If VWL<Vref, then the φWL booster circuit 153 boosts the word line driving signal φWL. If VWL>Vref, then the φWL booster circuit 153 does not boost the word line driving signal φWL.

As described above, the circuit of FIG. 1 performs a boosting operation at the end of active cycle automatically if necessary but does not perform if unnecessary to reduce the power consumption by the circuit.

FIG. 3 is a block diagram showing a basic structure of a semiconductor memory device (SRAM: static RAM) disclosed in Japanese laid-open patent publication No. 11-16368. FIG. 4 is a timing chart describing operations of the semiconductor memory device. An ATD circuit 110 detects any transitions of address signals A0~An or a chip select signal CE to generate a pulse signal φOS. An XE generator circuit 111 receives inputs of the pulse signal φOS which represents the address transition detection from the ATD circuit 110 and the chip select signal CE, and outputs a word line activation signal XE. The XE generator circuit 111 is free from the control by a write control signal /WE, for which reason operations with the signal XE are the same between the write and read cycles, and a high level output will be continued until a reset by the next signal φOS due to the address transition in the next cycle. The row decoder 102 receives an input of a row address signal and outputs a row selecting signal which selects a word line.

A boost signal generator circuit 114 receives inputs of the word line activation signal XE and the write control signal /WE, and generates a boost signal /φBEN which instructs the boost. Namely, in the write cycle where the write control signal /WE is low level, this boost signal generator circuit 114 continues to output the low level except for a reset time period, where the word line activation signal XE is in the low level. In the read cycle where the write control signal /WE is high level, this boost signal generator circuit 114 outputs the low level in a predetermined time period and subsequently outputs the high level.

A boost potential generating circuit 115 operates, if the boost signal /φBEN is in the low level, to generate a boost voltage VBST which is supplied to a word driver 104. The word driver 104 is powered by the boost voltage VBST and selects a word line based on inputs of the word line activation signal XE and the row selecting signal, whereby a potential of the selected word line is risen up to the boost voltage VBST, and a write operation to memory cells or a read operation from memory cells is accomplished.

A sense amplifier activation signal generating circuit 112 receives inputs of the word line activation signal XE and the write control signal /WE, and outputs a sense amplifier activation signal φSE. The sense amplifier activation signal φSE is generated only in the read cycle, and becomes high level with a time delay after the word line is risen. This high level will be continued to keep a sense amplifier 106 in active state until a reset by the signal φOS due to the address transition in the next cycle. The sense amplifier 106 receives an input of a signal on complementary digit lines DG, DGB selected by a column selecting switch 105 based on an output from a column decoder 103. The sense amplifier 106 performs an amplification of data from memory cells during when the sense amplifier activation signal φSE is high level.

As described above, the circuit shown in FIG. 3 makes the boost potential generating circuit 115 operable only in an initial time period of the read cycle, but inoperable in other time periods than the initial time period of the read cycle, in order to reduce the power consumption by the boost potential generating circuit 115.

The prior art is to reduce the power for driving the word lines but does not disclose any other power reduction method.

In recent years, the pseudo SRAM has been developed and practiced. As well known, this pseudo SRAM has an advantage in such a large capacity as DRAM and another advantage in such usefulness as SRAM as well as still another advantage of a reduced power consumption in stand-by-state, for which reason the pseudo SRAM has been used widely to the portable devices. For use of this pseudo SRAM to the portable devices, however, a further reduction of the power consumption is desired.

FIG. 5 is a block diagram illustrative of a basic structure of a conventional pseudo SRAM. FIG. 6 is a timing chart describing operations of the pseudo SRAM. The pseudo SRAM has a voltage level control circuit 1, a memory cell array 2, a ring oscillator 3, a boost circuit 4, and a word decoder 5. Further, the pseudo SRAM has a row decoder 6, a refresh timing generator circuit 7 and a row enable generator circuit 8.

The voltage level control circuit 1 generates, based on reference voltages Vref1 and Vref2, an internal voltage level control signal A which controls a level of the boost voltage Vbt to be applied to a word line of the memory cell array 2. An input side of the ring oscillator 3 is connected to an output side of the voltage level control circuit 1, so that the internal voltage level control signal A is inputted into the ring oscillator 3. The ring oscillator 3 is an oscillating circuit and may comprise a series connection in ring-shape of odd number inverters. If the internal voltage level control signal A outputted from the voltage level control circuit 1 is "H" (high level), then the ring oscillator 3 is activated to output an oscillation output B.

An input side of the boost circuit 4 is connected to an output side of the ring oscillator 3 so that the oscillation output B is inputted into the boost circuit 4. The boost circuit 4 may comprise a charge pump circuit. The boost circuit 4 utilizes the output B from the ring oscillator 3 and boosts a power voltage VDD up by step-by-step and outputs a boost voltage Vbt which is to drive the word line. An output side of the boost circuit 4 is connected to the word decoder 5 so that the boost voltage Vbt is inputted into the word decoder 5. In this case, the boost voltage Vbt is higher than the power voltage VDD, for example, (VDD+1.5V) or (VDD+2V). The word decoder 5 is connected to an output side of the row decoder 6, so that the word decoder 5 supplies the boost voltage Vbt to a word line selected by an output from the row decoder 6. The memory cell array 2 is a memory cell array having the same structure as the memory cell array of DRAM.

The refresh timing generating circuit 7 generates, at a constant time interval, a refresh signal for refreshing memory cells in the memory cell array 2 and a refresh address for designating an address of the memory cell to be refreshed. An output side of the refresh timing generating circuit 7 is connected to the row enable generating circuit 8 so that the refresh signal is inputted into the row enable generating circuit 8 and also the refresh address is inputted into the row decoder 6.

The row enable generating circuit 8 receives inputs of a write enable signal WE, a chip select signal CS and a read/write address Add for the memory cell array 2. Upon change or transition of the address Add, the row enable generating circuit 8 generates a row enable signal LT. The row enable generating circuit 8 generates the signal LT at the time when the refresh timing generating circuit 7 outputs the refresh signal. An output of the row enable generating circuit 8 is connected to the row decoder 6 and the voltage level control circuit 1, so that the row enable signal LT is inputted into the voltage level control circuit 1 and the row decoder 6. Upon receipt of the input of the row enable signal LT, the row decoder 6 decodes the read/write address Add externally entered and supplies a decoded result to the word decoder 5.

FIG. 6 is a timing chart describing operations of the circuit shown in FIG. 5. After the write enable signal WE becomes "L" (low level) and the chip select signal Cs becomes "H", then transition of the address Add causes that the row enable signal LT is outputted from the row enable generating circuit 8 and inputted into the voltage level control circuit 1. The voltage level control circuit 1 compares the boost voltage Vbt and the reference voltage Vref1. If the boost voltage Vbt is lower than the reference voltage Vref1, then the voltage level control circuit 1 makes the internal voltage level control signal A at "H" (high level) at the time "t1". The high level "H" of the internal voltage level control signal A starts the oscillation of the ring oscillator 3 and the ring oscillator 3 outputs the oscillation output B. The oscillation output B is then inputted into the boost circuit 4. The boost circuit 4 uses the oscillation output B for boosting the boost voltage Vbt. As the boost voltage Vbt is risen and reaches the reference voltage Vref2, then the voltage level control circuit 1 makes the internal voltage level control signal A at "L" (low level) at the time "t2", whereby the oscillation of the ring oscillator 3 is discontinued and boosting operation by the boost circuit 4 is thus discontinued.

As described above, in accordance with the conventional pseudo SRAM, the voltage level control circuit 1 activates the ring oscillator 3 and the boost circuit 4 only in the necessary time period but inactivates them in the unnecessary time period in order to reduce the power consumption.

The conventional semiconductor memory device, however, is designed for a power reduction of the circuit for generating a voltage to be applied to the memory cell array but does never for any power reduction of the voltage level control circuit 1 which controls the voltage to be applied to the memory cell array.

In accordance with the normal DRAM, the refresh timing is controlled by a system, and the device is needed to keep or hold always the boosted voltage level, for which reason it is unnecessary to reduce the power of the circuit for controlling the voltage to be applied to the memory cell array. There is no strict restriction to the power in the stand-by-state.

In contrast, the pseudo SRAM is needed for such a power reduction as many as SRAM. The pseudo SRAM is needed for a possible reduction of the power to be supplied to the voltage level control circuit. Namely, the pseudo SRAM is designed so that the refresh operation is invisible from an exterior of the device, wherein a refresh current is not considered in accordance with the regulation of the power consumption, for which reason the pseudo SRAM needs more strict regulations than the normal DRAM.

DISCLOSURE OF THE INVENTION

The present invention has been made to satisfy the above described requirements. An object of the present invention is to provide a voltage level control circuit designed for a possible reduction in the power consumption.

A further object of the present invention is to provide a method of controlling a voltage level for a possible reduction in the power consumption.

A further more object of the present invention is to provide a semiconductor memory device having a voltage level control circuit reduced in the power consumption.

The other objects, features and effects of the present invention will be apparent from the following descriptions.

In order to solve the above issues, the present invention provides a voltage level control circuit connected to an internal voltage level generating circuit generating an internal voltage level based on an external power voltage, the voltage level control circuit detecting and controlling the internal voltage level, wherein the voltage level control circuit includes:

a comparing circuit connected to an output side of the internal voltage level generating circuit for comparing the internal voltage level with at least one reference voltage; and a control circuit connected to the comparing circuit for controlling the comparing circuit in an active state or an inactive state.

It is possible that the control circuit makes the comparing circuit into the active state in order to make the internal voltage level generating circuit into an active state, and the control circuit also makes the comparing circuit into the inactive state in order to make the internal voltage level generating circuit into an inactive state.

It is possible that the internal voltage level generating circuit is a boost circuit or a voltage down circuit.

It is possible that the comparing circuit comprises the same number of comparing circuits as the number of the reference voltage, and the comparing circuit compares the internal voltage level with a corresponding reference voltage, and the control circuit comprises a single control circuit connected commonly to each of the comparing circuits, and each of the comparing circuits is commonly controlled by the single control circuit.

It is possible that the control circuit includes a logic gate circuit and a latch circuit, and an output of the logic gate circuit is connected to an input of the latch circuit, and a control terminal of the latch circuit is connected to an output side of the comparing circuit, and the active state or the inactive state of the comparing circuit is controlled based on an output signal from the logic gate circuit or an output signal from the comparing circuit.

It is possible that the comparing circuit includes a current mirror differential amplifier.

It is possible that the voltage level control circuit further includes a voltage dividing circuit which is connected in series between an output side of the internal voltage level generating circuit and a ground terminal, and an output of the voltage dividing circuit is connected to an input of the comparing circuit, and the comparing circuit compares a divided voltage of the internal voltage level with the reference voltage.

It is possible that an input of the comparing circuit is connected to an output side of the internal voltage level generating circuit for directly comparing the internal voltage level with the reference voltage.

It is possible that the at least one reference voltage comprises a single reference voltage, and a lower limit of an allowable range of the internal voltage level is decided based on the single reference voltage, and if the internal voltage level becomes below the lower limit of the allowable range, then an output signal from the voltage level control circuit is made into an active state in order to activate the internal voltage level generating circuit.

It is possible that the at least one reference voltage comprises a single reference voltage, and an upper limit of an allowable range of the internal voltage level is decided based on the single reference voltage, and if the internal voltage level becomes above the upper limit of the allowable range, then an output signal from the voltage level control circuit is made into an active state in order to activate the internal voltage level generating circuit.

It is possible that the at least one reference voltage comprises two reference voltages, and an upper limit and a lower limit of an allowable range of the internal voltage level are decided based on the two reference voltages, and if the internal voltage level becomes above the upper limit of the allowable range or below the lower limit of the allowable range, then an output signal from the voltage level control circuit is made into an active state in order to activate the internal voltage level generating circuit.

It is possible that the control circuit comprises a logic gate circuit, and an output of the logic gate circuit is connected to the comparing circuit the active state or the inactive state of the comparing circuit is controlled based on only an output signal from the logic gate circuit, independently from the active state or the inactive state of the internal voltage level generating circuit.

The present invention further provides a voltage level control circuit connected to an output side of an internal voltage level generating circuit, which generates an internal voltage level based on an external power voltage, and the voltage level control circuit detects and controls the internal voltage level based on at least one reference voltage externally inputted, and the voltage level control circuit including a control circuit for controlling an active state or an inactive state of the voltage level control circuit.

It is possible that the voltage level control circuit further includes a comparing circuit having an input connected to an output side of the internal voltage level generating circuit for comparing the internal voltage level with the at least one reference voltage, and the comparing circuit having an output side for outputting an internal voltage level generating circuit control signal which controls an active state or an inactive state of the internal voltage level generating circuit; and the control circuit is connected to the comparing circuit for controlling the comparing circuit in the active state or the inactive state.

It is possible that the control circuit makes the comparing circuit into the active state in order to make the internal voltage level generating circuit into an active state, and the control circuit also makes the comparing circuit into the inactive state in order to make the internal voltage level generating circuit into an inactive state.

It is possible that the internal voltage level generating circuit is a boost circuit or a voltage down circuit.

It is possible that the comparing circuit comprises the same number of comparing circuits as the number of the reference voltage, and the comparing circuit compares the internal voltage level with a corresponding reference voltage, and the control circuit comprises a single control circuit connected commonly to each of the comparing circuits, and each of the comparing circuits is commonly controlled by the single control circuit.

It is possible that the control circuit includes a logic gate circuit and a latch circuit, and an output of the logic gate circuit is connected to an input of the latch circuit, and a control terminal of the latch circuit is connected to an output side of the comparing circuit.

It is possible that the comparing circuit includes a current mirror differential amplifier.

It is possible that the voltage level control circuit further includes a voltage dividing circuit which is connected in series between an output side of the internal voltage level generating circuit and a ground terminal, and an output of the voltage dividing circuit is connected to an input of the comparing circuit, and the comparing circuit compares a divided voltage of the internal voltage level with the reference voltage.

It is possible that an input of the comparing circuit is connected directly to an output side of the internal voltage level generating circuit for directly comparing the internal voltage level with the reference voltage.

It is possible that the at least one reference voltage comprises a single reference voltage, and a lower limit of an allowable range of the internal voltage level is decided based on the single reference voltage, and if the internal voltage level becomes below the lower limit of the allowable range, then an output signal from the voltage level control circuit is made into an active state in order to activate the internal voltage level generating circuit.

It is possible that the at least one reference voltage comprises a single reference voltage, and an upper limit of an allowable range of the internal voltage level is decided based on the single reference voltage, and if the internal voltage level becomes above the upper limit of the allowable range, then an output signal from the voltage level control circuit is made into an active state in order to activate the internal voltage level generating circuit.

It is possible that the at least one reference voltage comprises two reference voltages, and an upper limit and a lower limit of an allowable range of the internal voltage level are decided based on the two reference voltages, and if the internal voltage level becomes above the upper limit of the allowable range or below the lower limit of the allowable range, then an output signal from the voltage level control circuit is made into an active state in order to activate the internal voltage level generating circuit.

It is possible that the control circuit comprises a logic gate circuit, and an output of the logic gate circuit is connected to the comparing circuit the active state or the inactive state of the comparing circuit is controlled based on only an output signal from the logic gate circuit, independently from the active state or the inactive state of the internal voltage level generating circuit.

The present invention further provides a semiconductor memory device including:

a memory cell array having a plurality of word line;

an internal voltage level generating circuit connected to the plurality of word line for generating an internal voltage level based on an external power voltage and supplying the internal voltage level to the word line; and a voltage level control circuit connected to the internal voltage level generating circuit for detecting and controlling the internal voltage level, wherein the voltage level control circuit includes:

a comparing circuit connected to an output side of the internal voltage level generating circuit for comparing the internal voltage level with at least one reference voltage; and a control circuit connected to the comparing circuit for controlling the comparing circuit in an active state or an inactive state.

It is possible that the semiconductor memory device further includes a refresh signal generating circuit generating a refresh signal for refresh operation of memory cells, and an output side of the refresh signal generating circuit is connected to the control circuit of the voltage level control circuit, and upon receipt of an input of the refresh signal, the control circuit of the voltage level control circuit is makes the comparing circuit into an active state from an inactive state.

It is possible that the control circuit of the voltage level control circuit includes a logic gate circuit, and a first input of plural inputs of the logic gate circuit is connected to an output side of the refresh signal generating circuit.

It is possible that the semiconductor memory device further includes a row enable signal generating circuit for generating a row enable signal which activates the word line except when a refresh operation is made, and an output of the row enable signal generating circuit is connected to a second input of the logic gate circuit, and when at least any one of the refresh signal and the row enable signal is inputted into the logic gate, then the control circuit makes the comparing circuit into an active state from an inactive state.

It is possible that the row enable signal generating circuit generates a pulse signal at a predetermined time before a timing of activating the row enable signal and the pulse signal is inputted into the logic gate circuit, and the control circuit of the voltage level control circuit makes the comparing circuit into an active state from an inactive state and also makes the internal voltage level generating circuit into an active state from an inactive state, and after the internal voltage level reaches an allowable voltage level range given by the at least one reference voltage, the control circuit of the voltage level control circuit makes the comparing circuit into the inactive state from the active state.

It is possible that when the semiconductor memory device is in an active state, the control circuit maintains the comparing circuit always in an active state, and when the semiconductor memory device is in a stand-by state, the control circuit controls the comparing circuit in an active state or an inactive state based on a control signal.

It is possible that the semiconductor memory device further includes:

a back bias generating circuit connected to an output side of the internal voltage level generating circuit for generating, based on the internal voltage level, a back bias voltage which is lower than a ground level and supplying the back bias voltage to a predetermined semiconductor region of the semiconductor memory device; and a back bias level deciding circuit connected to the predetermined semiconductor region for deciding a potential of the predetermined semiconductor region, and wherein if the back bias voltage level becomes above a predetermined allowable range, then the back bias level deciding circuit activates a back bias level deciding result signal; and an output of the back bias level deciding circuit is connected to a second input of the logic gate circuit, so that when at least any one of the refresh signal and the activated back bias level deciding result signal is inputted into the logic gate, then the control circuit makes the comparing circuit into an active state from an inactive state.

It is possible that the control circuit of the voltage level control circuit further includes a latch circuit, and an input of the latch circuit is connected to an output of the logic gate circuit, and a control terminal of the latch circuit is connected to an output of the voltage level control circuit.

It is possible that the control circuit makes the comparing circuit into the active state in order to make the internal voltage level generating circuit into an active state, and the control circuit also makes the comparing circuit into the inactive state in order to make the internal voltage level generating circuit into an inactive state.

It is possible that the internal voltage level generating circuit is a boost circuit or a voltage down circuit.

It is possible that the comparing circuit comprises the same number of comparing circuit as the number of the reference voltage, and the comparing circuit compares the internal voltage level with a corresponding reference voltage, and the control circuit comprises a single control circuit connected co only to each of the comparing circuits, and each of the comparing circuits is commonly controlled in its active state or inactive state by the single control circuit.

It is possible that the control circuit includes a logic gate circuit and a latch circuit, and an output of the logic gate circuit is connected to an input of the latch circuit, aid a control terminal of the latch circuit is connected to an output side ok the comparing circuit.

It is possible that the comparing circuit includes a current mirror differential amplifier.

It is possible that the voltage level control circuit further includes a voltage dividing circuit which is connected in series between an output side of the internal voltage level generating circuit and a ground terminal, and an output of the voltage dividing circuit is connected to an input of the comparing circuit, and the comparing circuit compares a divided voltage of the internal voltage level with the reference voltage.

It is possible that an input of the comparing circuit is connected directly to an output side of he internal voltage level generating circuit for directly comparing the internal voltage level with the reference voltage.

It is possible that the at least one reference voltage comprises a single reference voltage, and a lower limit of an allowable range of the internal voltage level is decided based on the single reference voltage, and if the internal voltage level becomes below the lower limit of the allowable range, then an output signal from the voltage level control circuit is made into an active state in order to activate the internal voltage level generating circuit.

It is possible that the at least one reference voltage comprises a single reference voltage, and an upper limit of an allowable range of the internal voltage level is decided based on the single reference voltage, and if the internal voltage level becomes above the upper limit of the allowable range, then an output signal from the voltage level control circuit is made into an active state in order to activate the internal voltage level generating circuit.

It is possible that the at least one reference voltage comprises two reference voltages, and an upper limit and a lower limit of an allowable range of the internal voltage level are decided based on the two reference voltages, and if the internal voltage level becomes above the upper limit of the allowable range or below the lower limit of the allowable range, then an output signal from the voltage level control circuit is made into an active state in order to activate the internal voltage level generating circuit.

It is possible that the control circuit comprises a logic gate circuit, and an output of the logic gate circuit is connected to the comparing circuit the active state or the inactive state of the comparing circuit is controlled based on only an output signal from the logic gate circuit, independently from the active state or the inactive state of the internal voltage level generating circuit.

It is possible that an output signal from the logic gate circuit is a pulse signal having a predetermined pulse width, and the comparing circuit is made into an inactive state after a time corresponding to the pulse width passes since the comparing circuit was made into an active state, independent from an active state or an inactive state of the internal voltage level generating circuit.

The present invention further provides a semiconductor memory device including:

a memory cell array having a plurality of word line;

an internal voltage level generating circuit connected to the plurality of word line for generating an internal voltage level based on an external power voltage and supplying the internal voltage level to the word line; and a voltage level control circuit connected to the internal voltage level generating circuit for detecting and controlling the internal voltage level, wherein the voltage level control circuit includes a control circuit for controlling the voltage level control circuit in an active state or an inactive state.

It is possible that the voltage level control circuit further includes a comparing circuit having an input connected to an output side of the internal voltage level generating circuit for comparing the internal voltage level with the at least one reference voltage, and the comparing circuit having an output side for outputting an internal voltage level generating circuit control signal which controls an active state or an inactive state of the internal voltage level generating circuit; and the control circuit is connected to the comparing circuit for controlling the comparing circuit in the active state or the inactive state.

The present invention further provides a semiconductor memory device including:

a memory cell array having a plurality of word line;

an internal voltage level generating circuit connected to the plurality of word line for generating an internal voltage level based on an external power voltage and supplying the internal voltage level to the word line; and a voltage level control circuit connected to the internal voltage level generating circuit for detecting and controlling the internal voltage level, wherein the voltage level control circuit is activated in response to an activation signal of the word line and is inactivated when the internal voltage level supplied to the word line reaches an allowable voltage level range.

The present invention further provides a semiconductor memory device including:

a memory cell array having a plurality of word line;

an internal voltage level generating circuit connected to the plurality of word line for generating an internal voltage level based on an external power voltage and supplying the internal voltage level to the word line; and a voltage level control circuit connected to the internal voltage level generating circuit for detecting and controlling the internal voltage level, wherein the voltage level control circuit is activated at a predetermined time before an activation signal for the word line is risen and the voltage level control circuit is inactivated when the internal voltage level supplied to the word line reaches an allowable voltage level range.

The present invention further provides a semiconductor memory device including:

a memory cell array having a plurality of word line;

an internal voltage level generating circuit connected to the plurality of word line for generating an internal voltage level based on an external power voltage and supplying the internal voltage level to the word line; and a voltage level control circuit connected to the internal voltage level generating circuit for detecting and controlling the internal voltage level, wherein the voltage level control circuit is activated in response to an activation signal of the word line and then inactivated after a predetermined time passes.

The present invention further provides a semiconductor memory device including:

a memory cell array having a plurality of word line;

a refresh signal generating circuit for generating a refresh signal which controls a refresh operation;

an internal voltage level generating circuit connected to the plurality of word line for generating an internal voltage level based on an external power voltage and supplying the internal voltage level to the word line; and a voltage level control circuit connected to the internal voltage level generating circuit for detecting and controlling the internal voltage level, wherein the voltage level control circuit is activated and inactivated in response to the refresh signal.

The present invention further provides a semiconductor memory device including:

a memory cell array having a plurality of word line;

an internal voltage level generating circuit connected to the plurality of word line for generating an internal voltage level based on an external power voltage and supplying the internal voltage level to the word line; and a voltage level control circuit connected to the internal voltage level generating circuit for detecting and controlling the internal voltage level, wherein if the semiconductor memory device is in a stand-by state, then the voltage level control circuit is activated in response to an activation signal for the word line and inactivated when the internal voltage level supplied to the word line reaches an allowable voltage level range, and if the semiconductor memory device is in an active state, then the voltage level control circuit remains always activated.

It is possible that the allowable voltage level range is defined by a predetermined first reference value and a predetermined second reference value.

It is possible that the internal voltage level generating circuit is a boost circuit.

It is possible that the internal voltage level generating circuit is a voltage down circuit.

The present invention further provides a semiconductor device including:

an internal voltage level generating circuit for generating an internal voltage level based on an external power voltage;

an internal circuit connected to the internal voltage level generating circuit for receiving a supply of the internal voltage level;

a voltage level control circuit connected to the internal voltage level generating circuit for detecting and controlling the internal voltage level, wherein the voltage level control circuit is activated in response to rising an activation signal, for the internal circuit and the voltage level control circuit is inactivated when the internal voltage level supplied to the internal circuit reaches an allowable voltage level range and the activation signal for the internal circuit becomes OFF-state.

It is possible that the voltage level control circuit controls the voltage level equal to a predetermined reference value.

It is possible that the voltage level control circuit is a boost circuit.

It is possible that the voltage level control circuit is a voltage down circuit.

The present invention further provides a method of controlling, based on a control signal, an active state and an inactive state of an internal voltage level control circuit which detects and controls an internal voltage level generated based on an external power voltage, wherein the internal voltage level control circuit is inactivated when the internal voltage level reaches an allowable voltage level range after the voltage level control circuit was activated.

It is possible that the allowable voltage level range is defined by a predetermined first reference value and a predetermined second reference value.

It is possible that the internal voltage level is a voltage level boosted from the external power voltage.

It is possible that the internal voltage level is a voltage level down from the external power voltage.

It is possible that the internal voltage level is a voltage level supplied to a word line of the semiconductor memory device, and the control signal is an activation signal for the word line.

It is possible that the semiconductor memory device is a semiconductor memory device having memory cells which need a refresh operation, and the activation signal for the word line is a signal which controls the refresh operation for refreshing the memory cells of the semiconductor memory device, and the internal voltage level control circuit is inactivated when the internal voltage level becomes above an upper limit of the allowable voltage level range.

The present invention further provides a method of controlling a voltage level for a semiconductor memory device having a voltage level control circuit which detects and controls a voltage level generated from an external power voltage and supplied to a word line, wherein the voltage level control circuit is activated in response to an activation signal of the word line, and the voltage level control circuit is inactivated when the voltage level supplied to the word line reaches an allowable voltage level range.

The present invention further provides a method of controlling, based on a control signal, an active state and an inactive state of an internal voltage level control circuit which detects and controls an internal voltage level generated based on an external power voltage and supplied to a word line of a semiconductor memory device, wherein the internal voltage level control circuit is activated at a predetermined time before a timing of activating an activation signal for the word line, and the internal voltage level control circuit is inactivated when the internal voltage level supplied to the word line reaches an allowable voltage level range.

The present invention further provides a method of controlling, based on a control signal, an active state and an inactive state of an internal voltage level control circuit which detects and controls an internal voltage level generated based on an external power voltage and supplied to a word line of a semiconductor memory device, wherein the internal voltage level control circuit is activated in response to an activation signal for the word line, and the internal voltage level control circuit is inactivated when a predetermined time passes.

The present invention further provides a method of controlling, based on a control signal, an active state and an inactive state of an internal voltage level control circuit which detects and controls an internal voltage level generated based on an external power voltage and supplied to a word line of a semiconductor memory device having memory cells which need refresh operations, wherein the internal voltage level control circuit is activated and inactivated in response to a signal which controls the refresh operations.

The present invention further provides a method of controlling, based on a control signal, an active state and an inactive state of an internal voltage level control circuit which detects and controls an internal voltage level generated based on an external power voltage and supplied to a word line of a semiconductor memory device, wherein if the semiconductor memory device is in a stand-by state, then the voltage level control circuit is activated in response to an activation signal for the word line and inactivated when the internal voltage level supplied to the word line reaches an allowable voltage level range, and if the semiconductor memory device is in an active state, then the voltage level control circuit remains always activated.

It is possible that the allowable voltage level range is defined by a predetermined first reference value and a predetermined second reference value.

It is possible that the internal voltage level is a voltage level boosted from the external power voltage.

It is possible that the internal voltage level is a voltage level down from the external power voltage.

The present invention further provides a method of controlling, based on a control signal, an active state and an inactive state of an internal voltage level control circuit which detects and controls an internal voltage level generated based on an external power voltage and supplied to an internal circuit, wherein the voltage level control circuit is activated in response to an activation signal for the internal circuit, and the voltage level control circuit is inactivated when the internal voltage level supplied to the internal circuit reaches an allowable voltage level range and the activation signal for the internal circuit becomes OFF-state.

It is possible that the voltage level control circuit controls the internal voltage level equal to a predetermined reference value.

It is possible that the internal voltage level is a voltage level boosted from the external power voltage.

It is possible that the internal voltage level is a voltage level down from the external power voltage.

THE BEST MODE FOR CARRYING OUT THE INVENTION

Figure 7:
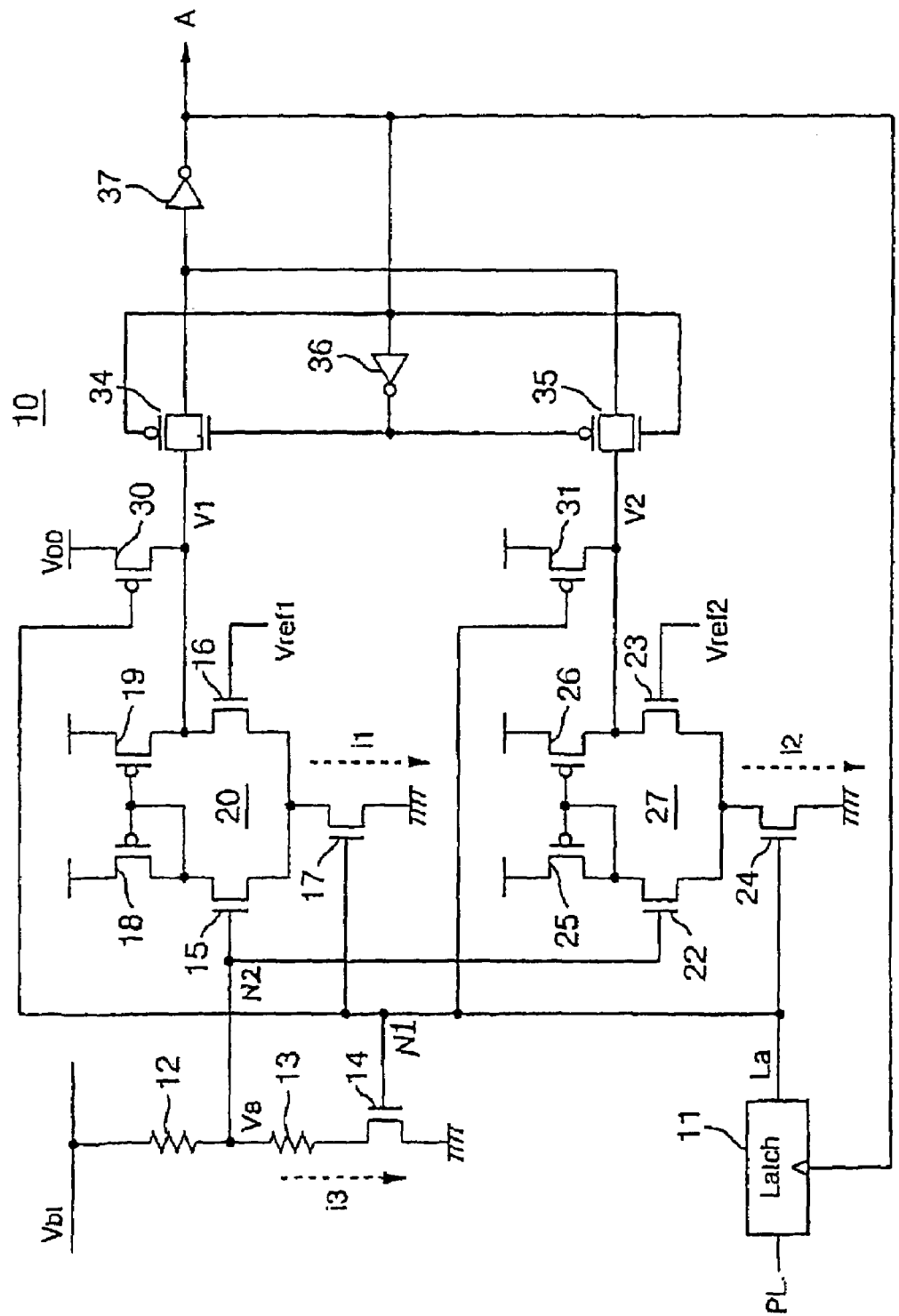
FIG. 7 is a circuit diagram illustrative of a structure of a voltage level control circuit in a first embodiment of the present invention.
Figure 8:
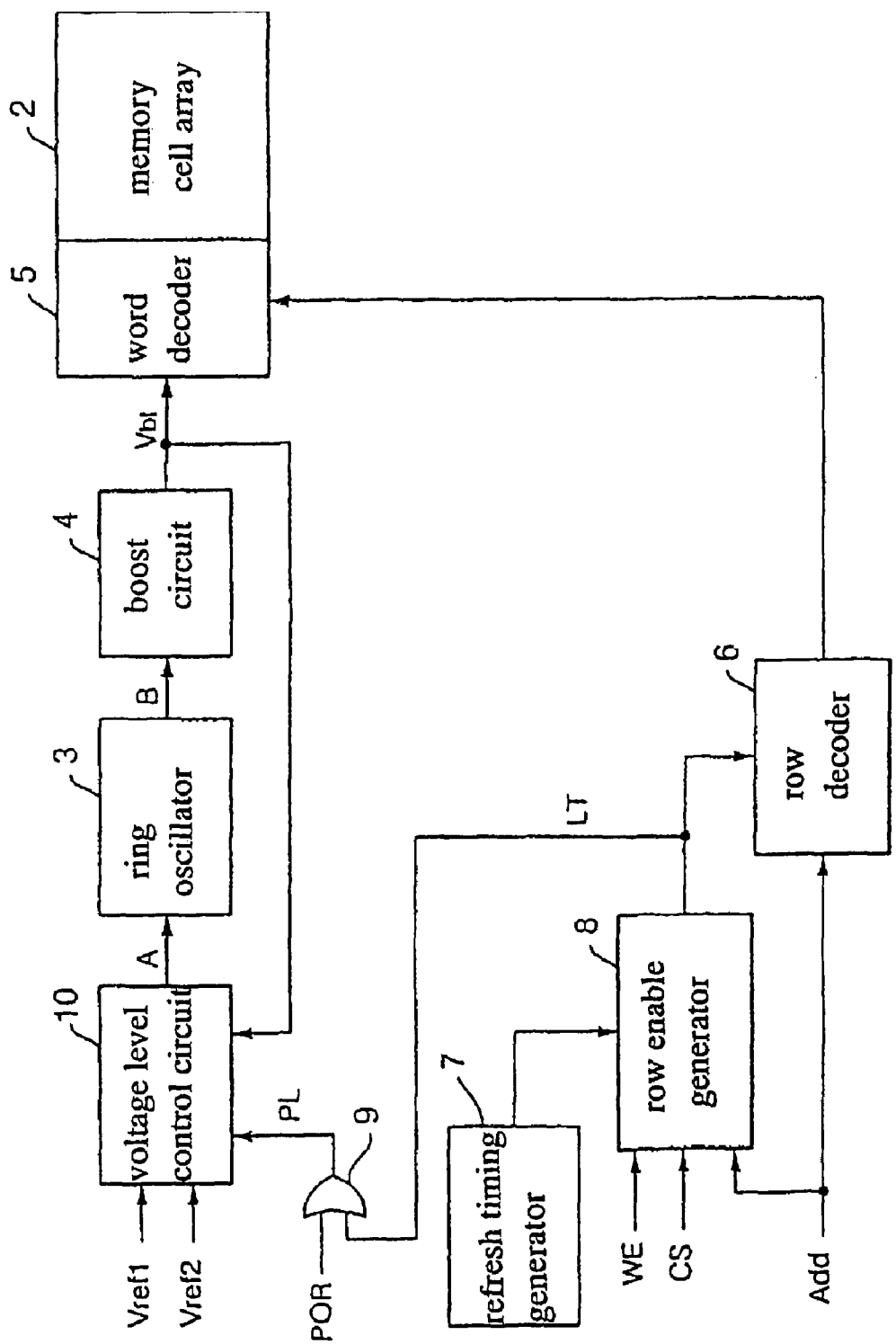
FIG. 8 is a block diagram illustrative of a basic structure of a pseudo SRAM, to which the voltage level control circuit is used.
Figure 9:
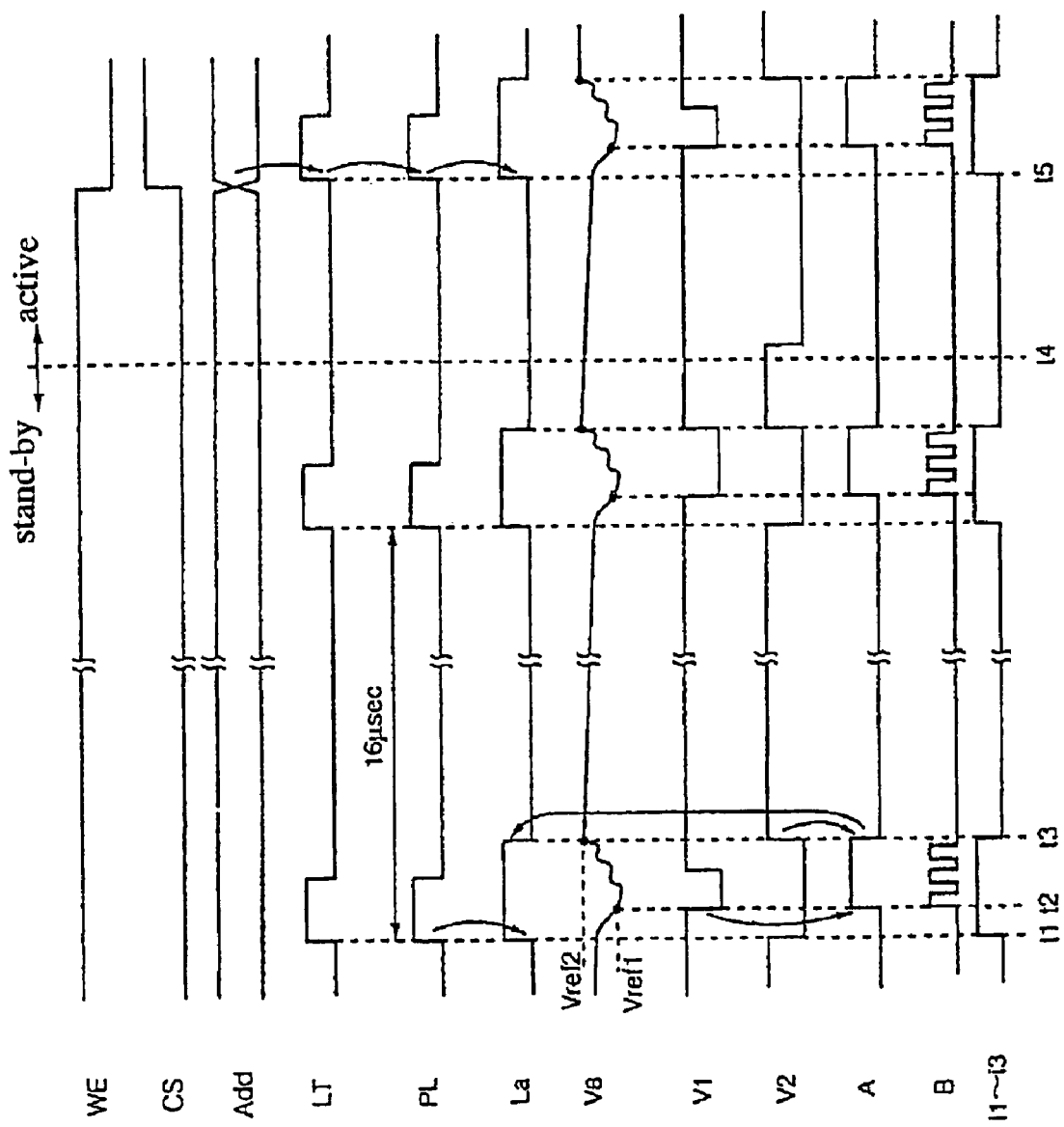
FIG. 9 is a timing chart describing operations in this embodiment.

The embodiments of the present invention will, hereinafter, be described with reference to the accompanying drawings. FIG. 7 is a circuit diagram illustrative of a structure of a voltage level control circuit in a first embodiment of the present invention. FIG. 8 is a block diagram illustrative of a basic structure of a pseudo SRAM having the voltage level control circuit shown in FIG. 7. FIG. 9 is a timing chart describing operations of the voltage level control circuit shown in FIG. 7.

Figure 1:
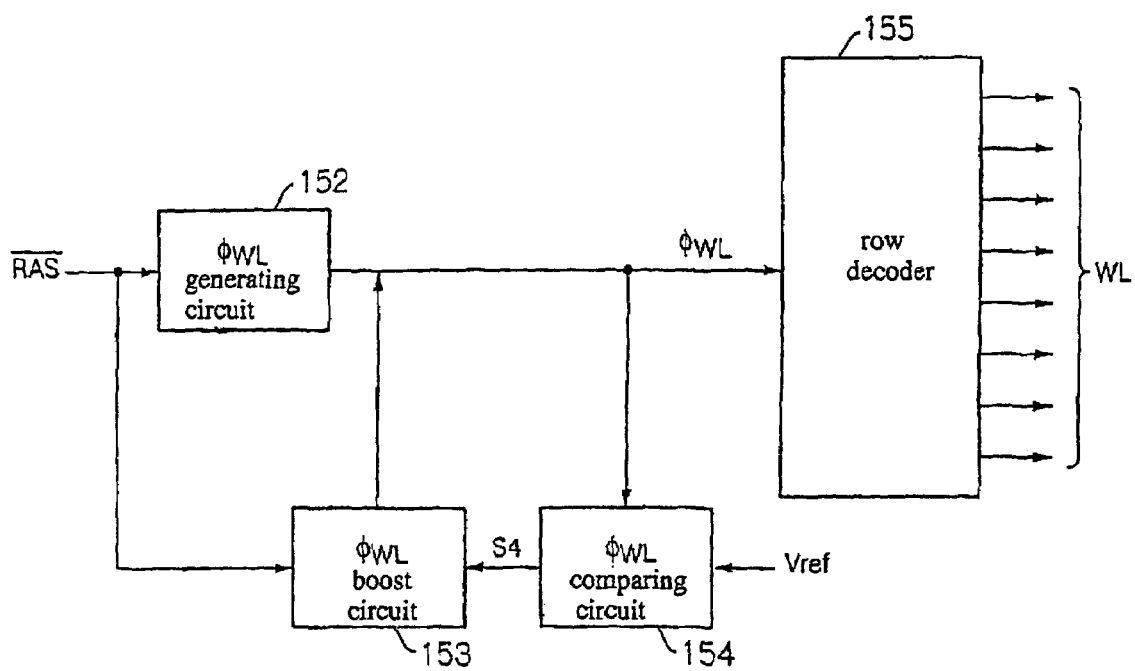
FIG. 1 is a block diagram showing a basic structure of the conventional DRAM.
Figure 2:
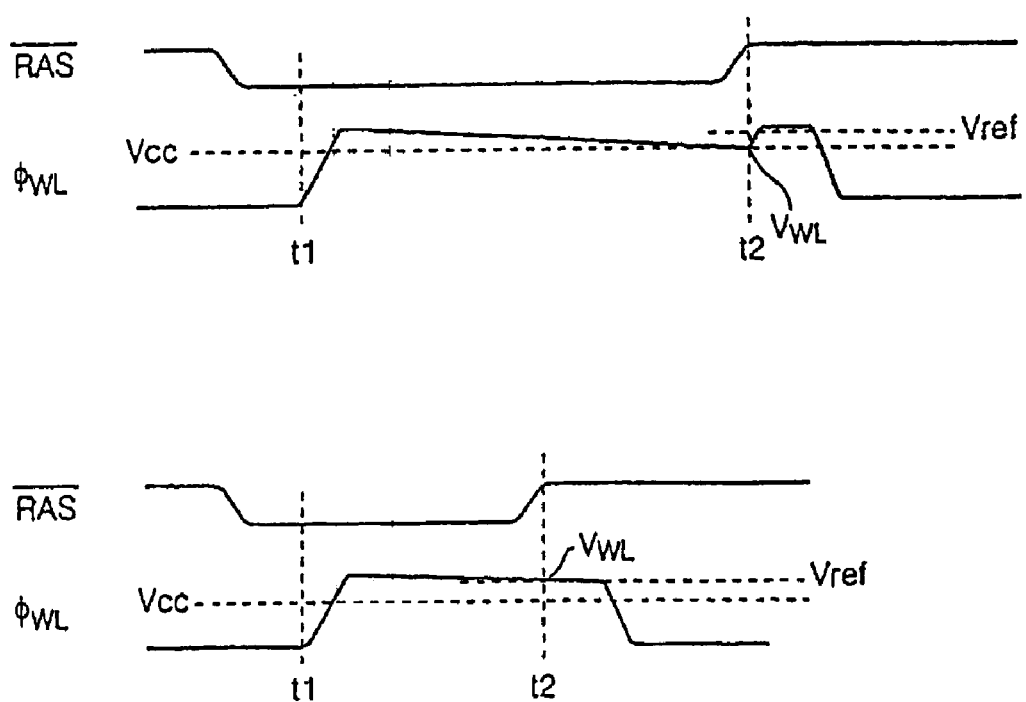
FIG. 2 is a timing chart describing the operations of the DRAM.
Figure 3:
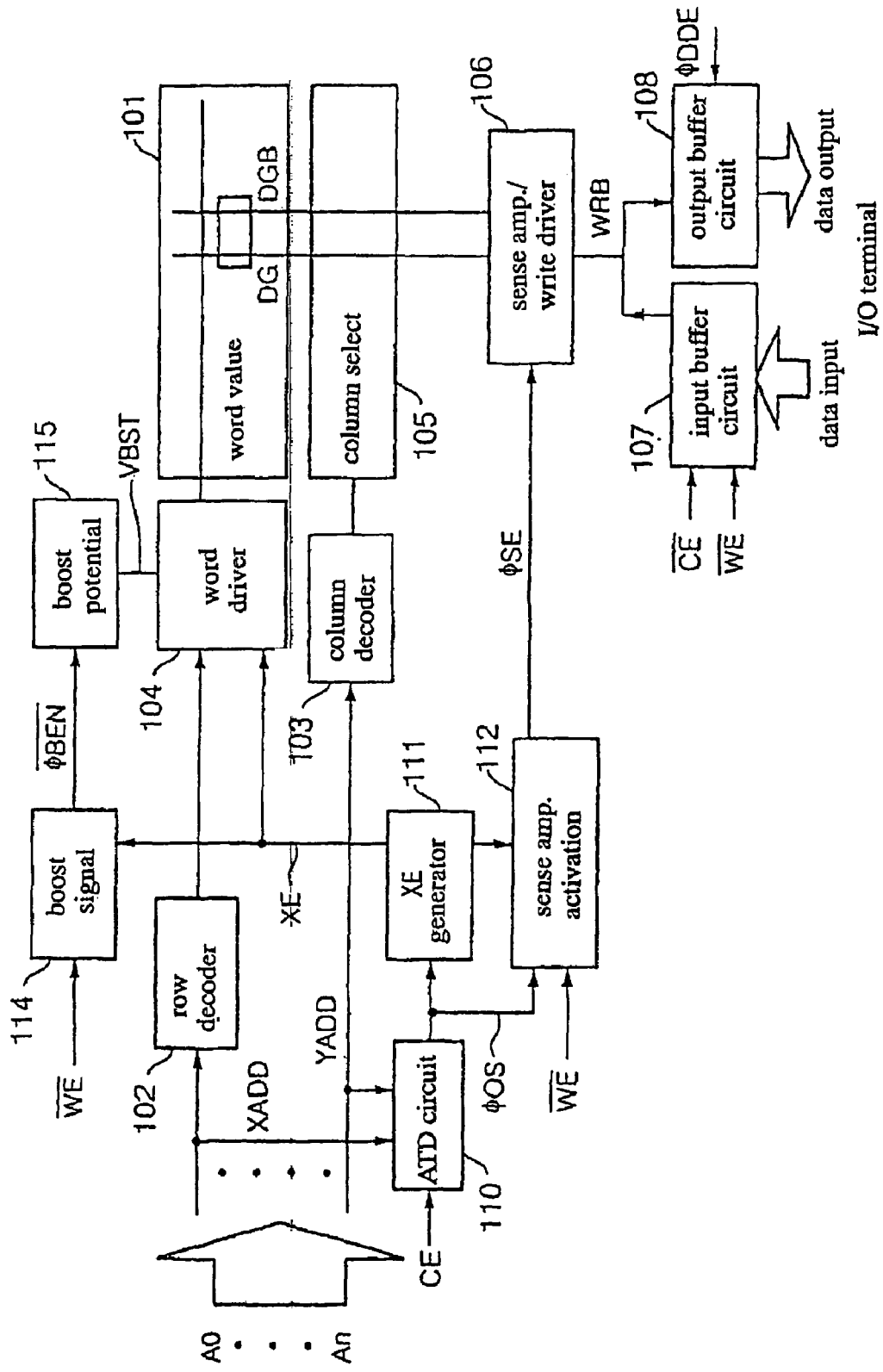
FIG. 3 is a block diagram showing a basic structure of the conventional SRAM.
Figure 4:
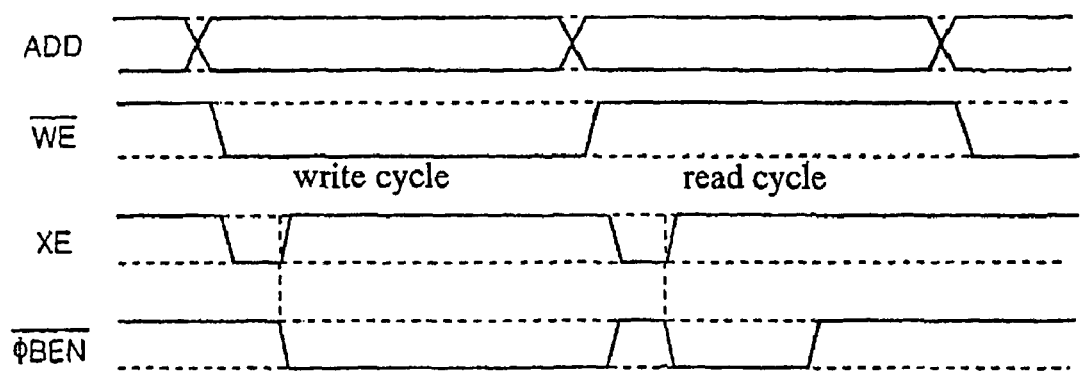
FIG. 4 is a timing chart describing the operations of the SRAM.
Figure 5:
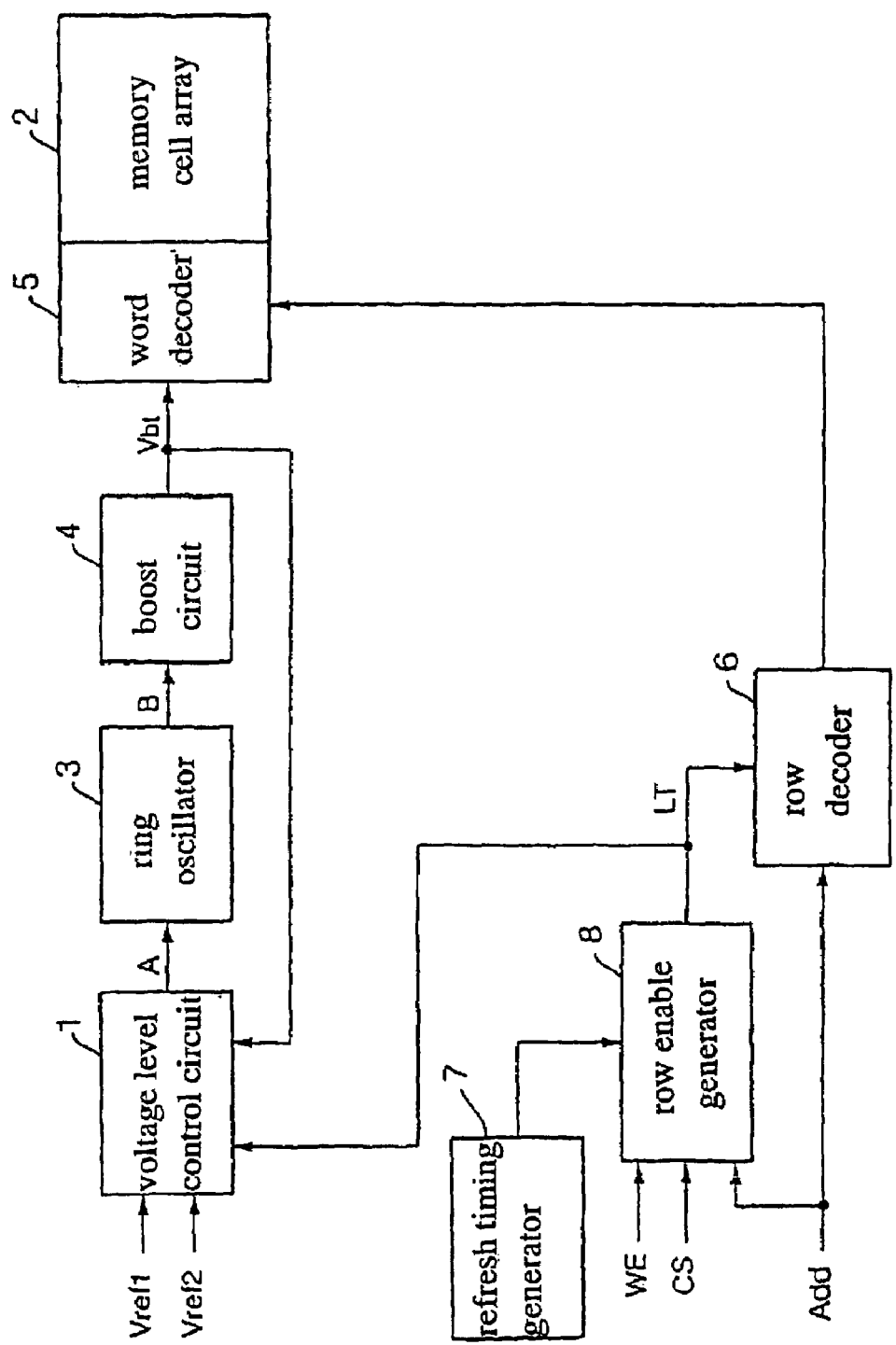
FIG. 5 is a block diagram illustrative of a basic structure of the conventional pseudo SRAM.
Figure 6:
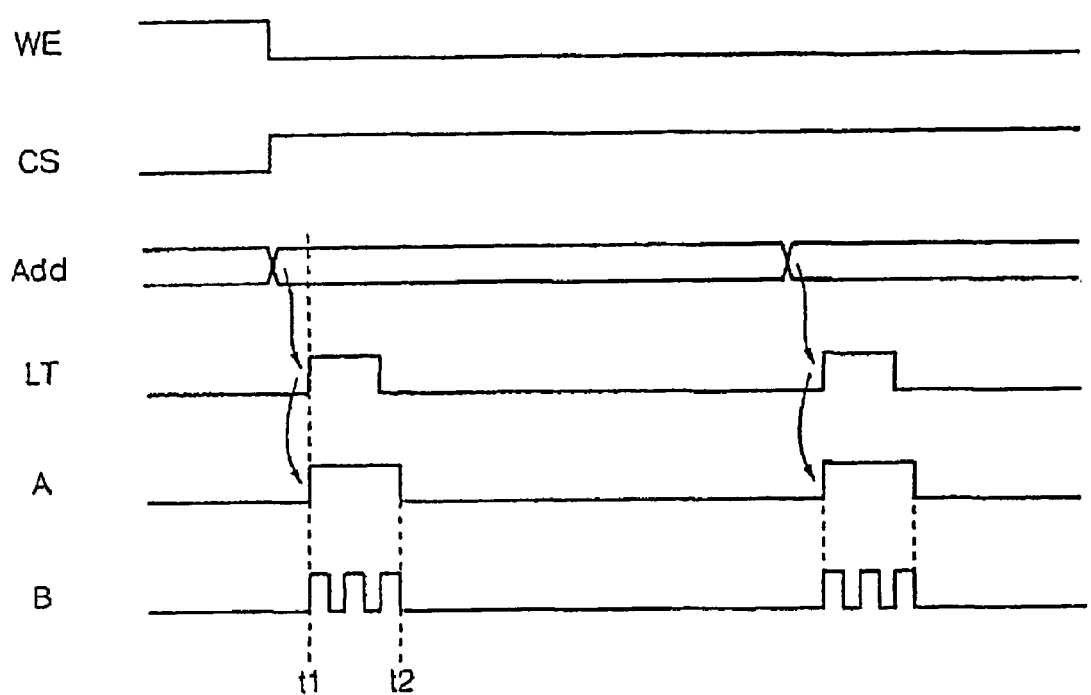
FIG. 6 is a timing chart describing operations of the pseudo SRAM.

The circuit shown in FIG. 8 in accordance with the present invention is different from the circuit of the prior art shown in FIG. 5 in view of provision of a logic gate and a structure of the voltage level control circuit. Respective circuit elements of a voltage level control circuit 10 integrated in a device are made active in application of the power to the device, in refreshing operations in stand-by-state of the device, in refreshing operations in active-state of the device, and in read/write operations in active-state of the device. The respective circuit elements of the voltage level control circuit 10 integrated in a device are made inactive in non-refresh operation in stand-by-state of the device, in non-refresh operation in active-state of the device, and in non-read/non-write operations, thereby to reduce a power to be consumed by the voltage level control circuit 10.

The pseudo SRAM in accordance with the present invention has a voltage level control circuit 10, a memory cell array 2, a ring oscillator 3, a boost circuit 4, a word decoder 5, a row decoder 6, a refresh timing generating circuit 7, a row enable generating circuit 8 and an OR-gate 9. This OR-gate 9 is provided for placing respective circuit elements of the voltage level control circuit 10 into active state upon application of a power to the device.

The voltage level control circuit 10 generates, based on reference voltages Vref1 and Vref2, an internal voltage level control signal A which controls a level of a boost voltage Vbt as an internal voltage which is applied to a word line of the memory cell array 2. An input side of the ring oscillator 3 is connected to an output side of the voltage level control circuit 10, so that the internal voltage level control signal A is inputted into the ring oscillator 3. The ring oscillator 3 is an oscillating circuit and may comprise a series connection in ring-shape of odd number inverters. If the internal voltage level control signal A outputted from the voltage level control circuit 1 is "H" (high level), then the ring oscillator 3 is activated to output an oscillation output B.

An input side of the boost circuit 4 is connected to an output side of the ring oscillator 3 so that the oscillation output B is inputted into the boost circuit 4. The boost circuit 4 may comprise a charge pump circuit. The boost circuit 4 utilizes the output B from the ring oscillator 3 and boosts a power voltage VDD up by step-by-step and outputs a boost voltage Vbt which is to drive the word line. An output side of the boost circuit 4 is connected to the word decoder 5 so that the boost voltage Vbt is inputted into the word decoder 5. In this case, the boost voltage Vbt is higher than the power voltage VDD, for example, (VDD+1.5V) or (VDD+2V). The word decoder 5 is connected to an output side of the row decoder 6, so that the word decoder 5 supplies the boost voltage Vbt to a word line selected by an output from the row decoder 6. The memory cell array 2 is a memory cell array having the same structure as the memory cell array of DRAM.

The refresh timing generating circuit 7 generates, at a constant time interval, a refresh signal for refreshing memory cells in the memory cell array 2 and a refresh address for designating an address of the memory cell to be refreshed. This constant time interval is decided within a time period for ensuring data to be held. The time interval for generating the refresh signal is not always constant, provided that the time interval is within the time period for ensuring data to be held. An output side of the refresh timing generating circuit 7 is connected to the row enable generating circuit 8 so that the refresh signal is inputted into the row enable generating circuit 8 and also the refresh address is inputted into the row decoder 6.

The row enable generating circuit 8 receives inputs of a write enable signal WE, a chip select signal CS and a read/write address Add for the memory cell array 2. Upon change or transition of the address Add, the row enable generating circuit 8 generates a row enable signal LT. The row enable generating circuit 8 generates the signal LT at the timing when the refresh timing generating circuit 7 outputs the refresh signal. An output of the row enable generating circuit 8 is connected to the row decoder 6, so that the row enable signal LT is inputted into the row decoder 6. Upon receipt of the input of the row enable signal LT, the row decoder 6 decodes the read/write address Add externally entered and supplies a decoded result to the word decoder 5.

The OR-gate 9 has first and second inputs. Upon application of the power, a power-on-reset signal POR is externally inputted into the first input. The second input is connected to an output side of the row enable generating circuit 8 for receiving an input of the row enable signal LT. Further, an output of the OR-gate 9 is connected to the voltage level control circuit 10. The OR-gate 9 takes the logical OR of the power-on-reset signal POR and the row enable signal LT and outputs a logical OR signal PL as a result. This logical OR signal is inputted into the voltage level control circuit 10. Upon application of the power, the power-on-reset signal POR becomes "H" (high level) in a predetermined time period, and the boost voltage Vbt is risen up to a predetermined level, thereby to ensure the refresh operation, the data read operation and the data write operation in an initial time period immediately after the power-on. The row enable signal LT is outputted from the row enable generating circuit 8 at the timing of transition of the read/write address Add externally entered and at the timing when the refresh signal is outputted from the refresh timing generating circuit 7.

The voltage level control circuit 10 is connected to an output side of the boost circuit 4, so that the boost voltage Vbt outputted from the boost circuit 4 is inputted into the word decoder 5 and also fed back to the voltage level control circuit 10. Further, the voltage level control circuit 10 receives inputs of the first and second reference voltages Vref1 and Vref2. The first reference voltage Vref1 is to define a lower limit of an allowable voltage level range of the boost voltage Vbt, while the second reference voltage Vref2 is to define an upper limit of the allowable voltage level range of the boost voltage Vbt. The first reference voltage Vref1 is a reference voltage for enabling the voltage level control circuit 10 to detect that the boost voltage Vbt becomes below the lower limit of the allowable voltage level range. The second reference voltage Vref2 is another reference voltage for enabling the voltage level control circuit 10 to detect that the boost voltage Vbt becomes above the upper limit of the allowable voltage level range. The first reference voltage Vref1 defining the lower limit of the allowable voltage level range is decided based on a minimum value of a necessary voltage range for accurate read or write operation to the memory cell. The second reference voltage Vref2 defining the upper limit of the allowable voltage level range is decided based on a withstand voltage regulation of a semiconductor device to be used.

The voltage level control circuit 10 outputs the internal voltage level control signal A so as to sustain the boost voltage Vbt within the allowable voltage level range defined by the first reference voltage Vref1 and the second reference voltage Vref2. As described above, upon application of the power to the device, respective circuit elements of the voltage level control circuit 10 are made active in refreshing operations in stand-by-state of the device, in refreshing operations in active-state of the device, and in read/write operations of the device in active-state. The respective circuit elements of the voltage level control circuit 10 are made inactive in non-refresh operations in stand-by-state of the device, in non-refresh operations in active-state of the device, and in non-read/non-write operations.

If the boost voltage Vbt fed back from the output side of the boost circuit 4 becomes below the lower limit of the allowable voltage level range, wherein the lower limit is defined by the first reference voltage Vref1, then the voltage level control circuit 10 is made active. The internal voltage level control signal A is made active to place the boost circuit 4 in the active state, thereby increasing the voltage level of the boost voltage Vbt. If the voltage level of the boost voltage Vbt is within the allowable voltage level range defined by the first reference voltage Vref1 and the second reference voltage Vref2, then the voltage level control circuit 10 is in the active state and sustains the internal voltage level control signal A in the active state, whereby the boost voltage Vbt is continued to be risen.

If the voltage level of the boost voltage Vbt becomes above the upper limit of the allowable voltage level range, wherein the upper limit is defined by the second reference voltage Vref2, then the voltage level control circuit 10 is placed into an inactive state from the active state, whereby the internal voltage level control sign A is made into the inactive state from the active state. The boost circuit 4 is also made into the inactive state to discontinue the increase of the voltage level of the boost voltage Vbt. After the boost circuit 4 becomes inactive state, the voltage level of the boost voltage Vbt is gradually decreased over time. Thus, the voltage level of the boost voltage Vbt is decreased though the allowable voltage level range and is made close to the lower limit of the allowable voltage level range, wherein the lower limit is defined by the first reference voltage Vref1, during when the voltage level control circuit 10 remains in the inactive state to sustain the internal voltage level control signal A in the inactive state. For example, if the device is in the stand-by-state, then the voltage level control circuit 10 remains in the inactive state in an interval time between the refresh operations, thereby to reduce the power to be consumed by the voltage level control circuit 10.

When the voltage level of the boost voltage Vbt becomes below the lower limit of the allowed voltage level range, wherein the lower limit is defined by the first referee voltage Vref1, then the voltage level control circuit 10 is again made into the active state from the inactive state, whereby the internal voltage level control signal A is also made into the active state from the inactive state. The boost circuit is also made into the active state from the inactive state to increase the voltage level of the boost voltage Vbt.

The voltage level control circuit 10 has such a circuit configuration as to exhibit the following operations.

The voltage level control circuit 10 has first and second inputs which receive inputs of the first reference voltage Vref1 and the second reference voltage Vref2, a third input which is connected to the output side of the boost circuit 4 for receiving the boost voltage Vbt outputted from the boost circuit 4, and a fourth input which is connected to an output of the OR-gate 9 for receiving an input of the logical OR signal PL outputted from the OR-gate 9. The voltage level control circuit 10 compares the boost voltage Vbt outputted from the boost circuit 4 to the first reference voltage Vref1 and the second reference voltage Vref2. The voltage level control circuit 10 switches the internal voltage level control signal A between the active state and the inactive state, thereby to switch the boost circuit 4 between the active state and the inactive state, so as to sustain the boost voltage Vbt outputted from the boost circuit 4 within the allowable voltage level range defined by the first reference voltage Vref1 and the second reference voltage Vref2.

Further, if the internal voltage level control signal A is in the active state, then the voltage level control circuit 10 is in the active state. If the internal voltage level control signal A is in the inactive state and if the application of the power, the refresh operation or the write/read operation is made, then the voltage level control circuit 10 is in the active state. If, however, the internal voltage level control signal A is in the inactive state and if no application of the power, no refresh operation and no write/read operation are made, then the voltage level control circuit 10 is in the inactive state.

As described above, the voltage level control circuit 10 controls the voltage level of the boost voltage Vbt based on the first reference voltage Vref1 and the second reference voltage Vref2. Namely, the voltage level control circuit 10 controls the voltage level of the boost voltage Vbt outputted from the boost circuit 4 within the allowable voltage level range defined by the first reference voltage Vref1 and the second reference voltage Vref2.

Both the first reference voltage Vref1 and the second reference voltage Vref2 are not necessarily essential, but depend upon operational conditions of the pseudo SRAM, to which the voltage level control circuit 10 is integrated. For example, it is possible to control the voltage level of the boost voltage Vbt based on at least one of the first reference voltage Vref1 and the second reference voltage Vref2.

For example, if the voltage level of the boost voltage Vbt is controlled by use of only the first reference voltage vref1, then the voltage level control circuit 10 operates as follows.

If the boost voltage Vbt fed back from the output side of the boost circuit 4 becomes below the lower limit of the allowable voltage level range, then the voltage level control circuit 10 is made into the active state. The internal voltage level control signal A is made into the active state. The boost circuit 4 is also made into the active state to increase the voltage level of the boost voltage Vbt. The voltage level control circuit 10 remains in the active state to sustain the internal voltage level control signal A in the active state and continue the increase of the boost voltage Vbt, until it takes a predetermined time after the voltage level control circuit 10 was made active.

After it takes a predetermined time since the voltage level control circuit 10 was made active, the voltage level control circuit 10 is made into the inactive state from the active state, whereby the internal voltage level control signal A is made into the inactive state from the active state. The boost circuit is made inactive to discontinue the increase in the voltage level of the boost voltage Vbt. After the boost circuit 4 has been in the inactive state, the voltage level of the boost voltage Vbt is gradually decreased over time. Namely, the voltage level of the boost voltage Vbt is slowly decreased through the allowable voltage level range and is made close to the lower limit of the allowable voltage level range, wherein the lower limit is defined by the first reference voltage Vref1. During this, the voltage level control circuit 10 remains in the inactive state to sustain the internal voltage level control signal A in the inactive state. For example, if the device is in the stand-by-state, the voltage level control circuit 10 remains in the inactive state in the time interval between the refresh operations to reduce the power to be consumed by the voltage level control circuit 10.

If the voltage level of the boost voltage Vbt becomes below the lower limit of the allowable voltage level range, wherein the lower limit is defined by the first reference voltage vref1, then the voltage level control circuit 10 is again made into the active state from the inactive state, whereby the internal voltage level control signal A is also made into the active state from the inactive state. The boost circuit is made into the active state from the inactive state to increase the voltage level of the boost voltage Vbt.

In case that the voltage level of the boost voltage Vbt is controlled based on the first reference voltage Vref1, the voltage level control circuit 10 may have the following circuit configuration.

The voltage level control circuit 10 has a first input which receives an input of the first reference voltage Vref1, a second input which is connected to the output side of the boost circuit 4 for receiving the boost voltage Vbt outputted from the boost circuit 4, and a third input which is connected to the output of the OR-gate 9 for receiving an input of the logical OR signal PL outputted from the OR-gate 9. The voltage level control circuit 10 compares the boost voltage Vbt outputted from the boost circuit 4 to the first reference voltage Vref1. The voltage level control circuit 10 switches the internal voltage level control signal A between the active state and the inactive state, thereby to switch the boost circuit 4 between the active state and the inactive state, so as to sustain the boost voltage Vbt outputted from the boost circuit 4 above the lower limit of the allowable voltage level range, wherein the lower limit is defined by the first reference voltage Vref1.

Further, if the internal voltage level control signal A is in the active state, then the voltage level control circuit 10 is in the active state. If the internal voltage level control signal A is in the inactive state and if the application of the power, the refresh operation or the write/read operation is made, then the voltage level control circuit 10 is in the active state. If, however, the internal voltage level control signal A is in the inactive state and if no application of the power, no refresh operation and no write/read operation are made, then the voltage level control circuit 10 is in the inactive state.

For example, if the voltage level of the boost voltage Vbt is controlled by use of only the second reference voltage vref2, then the voltage level control circuit 10 operates as follows.

The voltage level control circuit 10 is in the active state and the internal voltage level control signal A is also in the active state. The boost circuit 4 is also made into the active state to increase the voltage level of the boost voltage Vbt. If the voltage level of the boost voltage Vbt is below the upper limit of the allowable voltage level range, wherein the upper limit is defined by the second reference voltage Vref2, then voltage level control circuit 10 remains in the active state to sustain the internal voltage level control signal A in the active state and continue the increase of the boost voltage Vbt.

If the voltage level of the boost voltage Vbt is below the upper limit of the allowable voltage level range, wherein the upper limit is defined by the second reference voltage Vref2, then the voltage level control circuit 10 is made into the inactive state from the active state, whereby the internal voltage level control signal A is made into the inactive state from the active state. The boost circuit is made inactive to discontinue the increase in the voltage level of the boost voltage Vbt. After the boost circuit 4 has been in the inactive state, the voltage level of the boost voltage Vbt is gradually decreased over time. Namely, the voltage level of the boost voltage Vbt is slowly decreased through the allowable voltage level range. The voltage level control circuit 10 remains in the inactive state to sustain the internal voltage level control signal A in the inactive state in a predetermined time period after the voltage level control circuit 10 was made into the inactive state from the active state. For example, if the device is in the stand-by-state, the voltage level control circuit 10 remains in the inactive state in the time interval between the refresh operations to reduce the power to be consumed by the voltage level control circuit 10.

After it passes the predetermined time period since the voltage level control circuit 10 was made into the inactive state from the active state, the voltage level control circuit 10 is again made into the active state from the inactive state, whereby the internal voltage level control signal A is also made into the active state from the inactive state. The boost circuit is made into the active state from the inactive state to increase the voltage level of the boost voltage Vbt.

In case that the voltage level of the boost voltage Vbt is controlled based on the second reference voltage Vref2, the voltage level control circuit 10 may have the following circuit configuration.

The voltage level control circuit 10 has a first input which receives an input of the second reference voltage Vref2, a second input which is connected to the output side of the boost circuit 4 for receiving the boost voltage Vbt outputted from the boost circuit 4, and a third input which is connected to the output of the OR-gate 9 for receiving an input of the logical OR signal PL outputted from the OR-gate 9. The voltage level control circuit 10 compares the boost voltage Vbt outputted from the boost circuit 4 to the second reference voltage Vref2. The voltage level control circuit 10 switches the internal voltage level control signal A between the active state and the inactive state, thereby to switch the boost circuit 4 between the active state and the inactive state, so as to sustain the boost voltage Vbt outputted from the boost circuit 4 below the upper limit of the allowable voltage level range, wherein the upper limit is defined by the second reference voltage Vref2.

Further, if the internal voltage level control signal A is in the active state, then the voltage level control circuit 10 is in the active state. If the internal voltage level control signal A is in the inactive state and if the application of the power, the refresh operation or the write/read operation is made, then the voltage level control circuit 10 is in the active state. If, however, the internal voltage level control signal A is in the inactive state and if no application of the power, no refresh operation and no write/read operation are made, then the voltage level control circuit 10 is in the inactive state.

One example of the circuit configuration of the novel voltage level control circuit 10 in accordance with the present invention will be described in detail with reference to FIG. 7. The circuit configuration shown in FIG. 7 is just one preferred example for realizing the novel voltage level control circuit 10 in accordance with the present invention shown in FIG. 8. There is no limitation to this circuit configuration. The voltage level control circuit 10 controls the voltage level of the boost voltage Vbt based on both the first reference voltage Vref1 and the second reference voltage Vref2. In accordance with the below-described circuit configuration, the internal voltage level control signal A is switched between the active state and the inactive state to switch the boost circuit 4 between the active state and the inactive state, so as to sustain the boost voltage Vbt outputted from the boost circuit 4 within the allowable voltage level range defined by the first reference voltage Vref1 and the second reference voltage Vref2. Further, if the internal voltage level control signal A is in the active state, then the voltage level control circuit 10 is in the active state. If the internal voltage level control signal A is in the inactive state and if the application of the power, the refresh operation or the write/read operation is made, then the voltage level control circuit 10 is in the active state. If, however, the internal voltage level control signal A is in the inactive state and if no application of the power, no refresh operation and no write/read operation are made, then the voltage level control circuit 10 is in the inactive state.

As shown in FIG. 7, the voltage level control circuit 10 comprises a latch circuit 11, voltage-dividing resistances 12 and 13 for dividing the boost voltage Vbt, a first switching transistor 14 comprising an n-channel MOS field effect transistor, first and second current mirror differential amplifiers 20 an 27, second and third switching transistors 30 and 31 comprising p-channel MOS field effect transistors, first and second transfer gates 34 and 35 and first second inverters 36 and 37.

An input of the latch circuit 11 is connected to an output of the OR-gate 9 for receiving an input of the logical OR signal PL. A control terminal of the latch circuit 11 is connected to an output of the voltage level control circuit 10, so that the internal voltage level control signal A outputted from the voltage level control circuit 10 is fed back to the control terminal of the latch circuit 11. An output of the latch circuit 11 is connected to a node N1.

If the internal voltage level control signal A is in the high level "H" or in the active state, then input signal PL is latched. Namely, the input signal PL does not appear on the output from the latch circuit 11. At this time, a latch signal La becomes high level "H".

If the internal voltage level control signal A is in the low level "L" or in the inactive state, then input signal PL is not latched and passes through the latch circuit 11. Namely, the input signal PL having passed through the latch circuit 11 appears as a latch signal La on the output from the latch circuit 11.

The input signal PL becomes high level "H" when the power is applied to the device, the refresh operation is made in the stand-by-state or the active state of the device, and the write/read operations are made in the active state of the device. The input signal PL becomes low level "L" when non-refresh operation and non-write/non-read operation are made.

If the internal voltage level control signal A is in the high level "H" or in the active state or if the internal voltage level control signal A is in the low level "L" or in the inactive state and the power is applied to the device, the refresh operation is made in the stand-by-state or the active state of the device, and the write/read operations are made in the active state of the device, then the latch signal La becomes high level "H".

If the internal voltage level control signal A is in the low level "L" or in the inactive state and non-refresh operation and non-write/non-read operation are made, then the latch signal La becomes low level "L".

The voltage dividing resistances 12 and 13 for dividing the boost voltage Vbt and the first switching transistor 14 are connected in series between the output of the boost circuit 4 and the ground terminal, thereby forming a voltage dividing circuit. The voltage dividing resistance 12 is connected between the output of the boost circuit 4 and an output of the voltage dividing circuit. The voltage dividing resistance 13 is connected between the output of the voltage dividing circuit and the first switching transistor 14. The first switching transistor 14 is connected in series between the voltage dividing resistance 13 and the ground terminal. A divided voltage VB appears on the output from the voltage dividing circuit. The output of the voltage dividing circuit is connected to a node N2. A gate electrode of the first switching transistor 14 is connected to the node N1 for receiving an input of the latch signal La.

The first switching transistor 14 comprising the n-channel MOS field effect transistor turns ON upon receipt of the high level "H" of the latch signal La and turns OFF upon receipt of the low level "L" of the latch signal La.

If the internal voltage level control signal A is in the high level "H" or in the active state or if the internal voltage level control signal A is in the low level "L" or in the active state and the power is applied to the device, the refresh operation is made in the stand-by-state or the active state of the device, and the write/read operations are made in the active state of the device, then the latch signal La becomes high level "H", whereby the first switching transistor 14 turns ON and a current i3 flows through the voltage dividing circuit. As a result, the divided voltage VB from the boost voltage Vbt appears on the output from the voltage dividing circuit, whereby a potential of the node N2 becomes equal to the divided voltage VB, wherein the voltage dividing circuit is in the active state.

If the internal voltage level control signal A is in the low level "L" or in the inactive state and non-refresh operation and non-write/non-read operation are made, then the latch signal La becomes low level "L", whereby the first switching transistor 14 turns OFF, and no current flows through the voltage dividing circuit, wherein the voltage dividing circuit is in the inactive state.

The first current mirror differential amplifier 20 comprises three n-channel MOS field effect transistors 15, 16, and 17 and two p-channel MOS field effect transistors 18 and 19. The two n-channel MOS field effect transistors 15 and 17 and the single p-channel MOS field effect transistor 18 are connected in series between a power voltage VDD as an external voltage and a ground line. The two n-channel MOS field effect transistors 16 and 17 and the single p-channel MOS field effect transistor 19 are connected in series between the power voltage VDD as the external voltage and the ground line.

A gate electrode of the n-channel MOS field effect transistor 15 is connected to the node N2 for receiving an application of the divided voltage VB. A gate electrode of the n-channel MOS field effect transistor 17 is connected to the node N1 for receiving an application of the latch signal La. Gate electrodes of the p-channel MOS field effect transistors 18 and 19 are connected to each other and also connected to a drain of the n-channel MOS field effect transistor 15. A gate electrode of the n-channel MOS field effect transistor 16 is applied with the first reference voltage Vref1. A drain of the n-change, MOS field effect transistor 16 is connected to an output of the first current mirror differential amplifier 20, so that a drain voltage of the n-channel MOS field effect transistor 16 appears as an output voltage V1 on the output from the first current mirror differential amplifier 20.

When the latch signal La becomes high level "H", the first switching transistor 14 turns ON, whereby the current i3 flows through the voltage dividing circuit. The divided voltage VB from the boost voltage Vbt appears on the output from the voltage dividing circuit, whereby the potential of the node N2 becomes equal to the divided voltage VB, wherein the voltage dividing circuit is in the active state. The divided voltage VB is applied to the gate electrode of the n-channel MOS field effect transistor 15. Further, a gate electrode of the n-channel MOS field effect transistor 17 is applied with the latch signal La of the high level "H", whereby the n-channel MOS field effect transistor 17 turns ON. As a result, the first current mirror differential amplifier 20 becomes active, whereby a current i1 flows through the n-channel MOS field effect transistor 17. Namely, when the latch signal La becomes high level "H", the first current mirror differential amplifier 20 is made into the active state.

If the divided voltage VB is greater than the first reference voltage Vref1, then an output voltage V1 from the first current mirror differential amplifier 20 is high level "H". If the divided voltage VB is lower than the first reference Voltage Vref1, then the output voltage V1 from the first current mirror differential amplifier 20 is low level "L". Therefore, the first current mirror differential amplifier 20 detects whether the vided voltage VB is higher or lower than the first reference voltage Vref1, based on the output voltage V1 therefrom.

When the latch signal La becomes low level "L", the first switching transistor 14 turns OFF, and no current flows through the voltage dividing circuit, whereby the voltage dividing circuit becomes inactive. Further, the gate electrode of the n-channel MOS field effect transistor 17 is applied with the latch signal La of the low level "L", whereby the n-channel MOS field effect transistor 17 turns OFF, so that the first current mirror differential amplifier 20 becomes inactive. Namely, when the latch signal La becomes low level "L", the first current mirror differential amplifier 20 becomes inactive.

The second current mirror differential amplifier 27 comprises three n-channel MOS field effect transistors 22, 23, and 24 and two p-channel MOS field effect transistors 25 and 26. The two n-channel MOS field effect transistors 22 and 24 and the single p-channel MOS field effect transistor 25 are connected in series between the power voltage VDD as the external voltage and the ground line. The two n-channel MOS field effect transistors 23 and 24 and the single p-channel MOS field effect transistor 26 are connected in series between the power voltage VDD as the external voltage and the ground line.

A gate electrode of the n-channel MOS field effect transistor 22 is connected to the node N2 for receiving an application of the divided voltage VB. A gate electrode of the n-channel MOS field effect transistor 24 is connected to the node N1 for receiving an application of the latch signal La. Gate electrodes of the p-channel MOS field effect transistors 25 and 26 are connected to each other and also corrected to a drain of the n-channel MOS field effect transistor 22. A gate electrode of the n-channel MOS field effect transistor 23 is applied with the second reference voltage Vref2. A drain of the n-channel MOS field effect transistor 23 is connected to an output of the second current mirror differential amplifier 27, so that a drain voltage of the n-channel MOS field effect transistor 23 appears as an output voltage V2 on the output from the second current mirror differential amplifier 27.

When the latch signal La becomes high level "H", the second switching transistor 14 turns ON, whereby the current i3 flows through the voltage dividing circuit. The divided voltage VB from the boost voltage Vbt appears on the output from the voltage dividing circuit, whereby the potential of the node N2 becomes equal to the divided voltage VB, wherein the voltage dividing circuit is in the active state. The divided voltage VB is applied to the gate electrode of the n-channel MOS field effect transistor 22. Further, a gate electrode of the n-channel MOS field effect transistor 24 is applied with the latch signal La of the high level "H", whereby the n-channel MOS field effect transistor 24 turns ON. As a result, the second current mirror differential amplifier 27 becomes active, whereby a current i2 flows through the n-channel MOS field effect transistor 24. Namely, when the latch signal La becomes high level "H", the second current mirror differential amplifier 27 is made into the active state.

If the divided voltage VB is greater than the second reference voltage Vref2, then an output voltage V2 from the second current mirror differential amplifier 27 is high level "H". If the divided voltage VB is lower than the second reference voltage Vref2, then the output voltage V2 from the second current mirror differential amplifier 27 is low level "L". Therefore, the second current mirror differential amplifier 27 detects whether the vided voltage is higher or lower than the second reference voltage Vref2, based on the output voltage V2 therefrom.

When the latch signal La becomes low level "L", the second switching transistor 14 turns OFF, and no current flows through the voltage dividing circuit, whereby the voltage dividing, circuit becomes inactive. Further, the gate electrode of the n-channel MOS field effect transistor 24 is applied with the latch signal La of the low level "L", whereby the n-channel MOS field effect transistor 24 turns OFF, so that the second current mirror differential amplifier 27 becomes inactive. Namely, when the latch signal La becomes low level "L", the second current mirror differential amplifier 27 becomes inactive.

Namely, if the latch signal La becomes high level "H", then the voltage dividing circuit and the first and second current mirror differential amplifiers 20 and 27 become active, whereby the current i3 flows through the voltage dividing circuit and the current i1 flows through the first current mirror differential amplifier 20 and the current i2 flows through the second current mirror differential amplifier 27, resulting in a power consumption.

If the latch signal becomes La becomes low level "L", then the voltage dividing circuit and the first and second current mirror differential amplifiers 20 and 27 become inactive, whereby no currents flow, resulting in no power consumption.

A second switching transistor 30 comprising a p-channel MOS field effect transistor is connected between the output of the first current mirror differential amplifier 20 and the power voltage. A gate electrode of the second switching transistor 30 is connected to the node N1 for receiving an application of the latch signal La.

A third switching transistor 31 comprising a p-channel MOS field effect transistor is connected between the output of the second current mirror differential amplifier 27 and the power voltage. A gate electrode of the third switching transistor 31 is connected to the node N1 for receiving an application of the latch signal La.

If the latch signal La becomes high level "H", then the voltage dividing circuit and the first and second current mirror differential amplifiers 20 and 27 become active, while the second and third switching transistors 30 and 31 turn OFF, whereby the outputs from the first and second current mirror differential amplifiers 20 and 27 are made disconnected from the power voltage VDD.

If the latch signal La becomes low level "L", then the voltage dividing circuit and the first and second current mirror differential amplifiers 20 and 27 become inactive, while the second and third switching transistors 30 and 31 turn ON, whereby the outputs from the first and second current mirror different amplifiers 20 and 27 are made connected from the power voltage VDD as the external voltage. As a result, the outputs from the first and second current mirror differential amplifiers 20 and 27 are forced to be risen up to the power voltage VDD.

The first transfer gate 34 comprises a single pair of an n-channel MOS field effect transistor and a p-channel MOS field effect transistor, which are connected in parallel to each other between the output of the first current mirror differential amplifier 20 and an input of the second inverter 37.

The second transfer gate 35 comprises another single pair of an n-channel MOS field effect transistor and a p-channel MOS field effect transistor, which are connected in parallel to each other between the output of the second current mirror differential amplifier 27 and the input of the second inverter 37.

A gate electrode of the n-channel MOS field effect transistor of the first transfer gate 34 is connected to a gate electrode of the p-channel MOS field effect transistor of the second transfer gate 35. Those gate electrodes are connected to an output of the first inverter 36.

A gate electrode of the p-channel MOS field effect transistor of the first transfer gate 34 is connected to a gate electrode of the n-channel MOS field effect transistor of the second transfer gate 35. Those gate electrodes are connected to the input of the first inverter 36.

The output of the second inverter 37 is connected to the output of the voltage level control circuit 10 and also connected to the control terminal of the latch circuit 11.

If the output from the second inverter 37 becomes high level "H", then the first transfer gate 34 turns OFF. If the output from the second inverter 37 becomes low level "L", then the first transfer gate 34 turns ON.

If the output from the second inverter 37 becomes high level "H", then the second transfer gate 35 turns ON. If the output from the second inverter 37 becomes low level "L", then the second transfer gate 35 turns OFF.

Operations of the above-described circuit will be described with reference to the timing chart shown in FIG. 9.

Upon application of the power, the latch circuit 11 resets the latch signal La into the low level "L", whereby the p-channel MOS field effect transistors 30 and 31 turn ON. As a result, the output signal A from the voltage level control circuit 10 is the low level "L" independent from whether either one of the transfer gates 34 and 35 is in the ON-state. If the signal A becomes low level "L", then the transfer gate 34 turns ON, while the transfer gate 35 turns OFF. At this time, the n-channel MOS field effect transistors 14, 17 and 24 are in the OFF-state.

In this states, the power-on-reset signal POR is applied to the OR-gate 9, whereby the output signal PL from the OR-gate 9 becomes high level "H". At this time, the signal A is low level "L", and the latch circuit 11 is in the through state. Accordingly, the latch signal La is the high level "H". After the latch signal La becomes the high level "H", the p-channel MOS field effect transistors 30 and 31 turn OFF, while the n-channel MOS field effect transistors 14, 17, and 24 turn ON, whereby the voltage dividing circuit comprising the resistances 12 and 13 are made active, and the current mirror differential amplifiers 20 and 27 are also made active. At this time, the operations of the ring oscillator 3 and the boost circuit 4 have not yet been started, for which reason the boost voltage Vbt has still been in the low level. Therefore, the voltage VB is lower than the reference voltage Vref1. The output voltage V1 from the current mirror differential amplifier 20 becomes low level "L" while the output A from the voltage level control circuit 10 becomes high level "H". The signal A of the high level "H" makes the transfer gate 34 turn OFF and the transfer gate 35 turn ON, so that the voltage V2 (of low level "L" at this time) is supplied through the transfer gate 35 to the inverter 37. After the signal A becomes high level "H", then the latch circuit 11 latches the current value "H" of the signal PL.

The signal A becomes high level "H" and this high level "H" signal is supplied to the ring oscillator 3, whereby the ring oscillator 3 starts its oscillation operation. The oscillation signal B is supplied to the boost circuit 4. The boost circuit 4 utilizes this oscillation signal B to boost, in step-by-step, the boost voltage Vbt which will be then supplied to the word decoder 5 and also will be fed back to the voltage level control circuit 10.

When the boost voltage Vbt is gradually increased and becomes larger than the reference voltage Vref1, the voltage V1 becomes high level "H". At this time, the transfer gate 34 is in the OFF state, for which reason no influence is given to the circuit operation. As the boost voltage Vbt is further increased and becomes larger than the reference voltage Vref2, the voltage V2 becomes high level "H", whereby the signal A becomes low level "L", and the operation of the ring oscillator 3 and the boost circuit 4 are discontinued. The signal A of the low level "L" makes the latch circuit 11 into the through state. If at this time, the power-on-reset signal POR has already become low level "L", then the latch signal La becomes low level "L", whereby the p-channel MOS field effect transistors 30 and 31 turn ON, while the n-channel MOS field effect transistors 14, 17 and 24 turn OFF.

Upon application of the power, the boost operation of the boost voltage Vbt is made. When the voltage VB divided from the boost voltage Vbt reaches the reference voltage Vref2, the boost operation is finished. In case of the stand-by-state, refresh signals are outputted from the refresh timing generating circuit 7 at a time interval of about 16 microseconds, and then supplied to the row enable generating circuit 8. The row enable generating circuit 8 receives the refresh signal and generates the signal LT which is supplied to the OR-gate 9 and the row decoder 6. The refresh timing signal generating circuit 7 generates the refresh address at the same time of generating the refresh signal, so that the refresh address is supplied to the row decoder 6. The row decoder 6 decodes the refresh address and supplies the decode result to the word decoder 5.

Operations of the voltage level control circuit 10 in the stand-by-state described above will be described with reference to FIG. 9. At a time t1, the signal LT (of high level "H") is supplied to the OR-gate 9, and the output signal PL from the OR-gate 9 becomes high level "H". Thus, the latch signal La becomes high level "H". The latch signal La of the high level "H" makes the p-channel MOS field effect transistors 30 and 31 turn OFF, while the n-channel MOS field effect transistors 14, 17 and 24 turn ON. The voltage dividing circuit comprising the resistances 12 and 13 and the first and second current mirror differential amplifiers 20 and 27 are made active.

At this time, if the voltage VB is between the first and second reference voltages Vref1 an Vref2, the voltage V1 remains high level "H", while the voltage V2 becomes low level "L". At this time, the transfer gate 35 is in the OFF-state. Thus, the change or variation of the voltage V2 does not give any influence to the circuit operation. The signal A remains low level "L". If at the time t1 the voltage VB is below the first reference voltage Vref1, then the voltage V1 becomes low level at the time t1.

Upon rising the signal LT, the refresh operation is started, and the power consumption of the boost voltage Vbt becomes larger, while the boost voltage Vbt becomes gradually decreased. At a time t2, the voltage VB becomes lower than the first reference voltage Vref1, and the voltage V1 becomes low level "L", whereby the signal A becomes high level "H". The signal A of the high level "H" causes starts of the operations of the ring oscillator 3 and the boost circuit 4. The boost voltage Vbt is increased step-by-step. The signal A of the high level "H" causes that the latch circuit 11 latches the signal PL of the high level "H" at this time, and the transfer gate 34 turns OFF, while the transfer gate 35 turns ON. The transfer gate 35 in the ON-state allows the voltage V2 (of low level "L" at this time) to be supplied to the inverter 37.

The boost voltage Vbt is increased and at a time t3, the voltage VB becomes larger than the second reference voltage Vref2, whereby the voltage V2 becomes high level "H", and thus the signal A becomes low level "L". The signal A of the low level "L" causes that the operations of the ring oscillator 3 and the boost circuit 4 are discontinued. The signal A of the low level "L" also cases that the transfer gate 34 tuns ON, while the transfer gate 35 turns OFF. The signal A of the low level "L" also places the latch circuit 11 in the through state. Since at this time, the signal PL has already been in the low level "L", the latch signal La becomes low level "L", whereby the p-channel MOS field effect transistors 30 and 31 turn ON, while the n-channel MOS field effect transistors 14, 17 and 24 turn OFF.

The above operations will be repeated every when the refresh signal is outputted from the refresh timing generating circuit 7. For example, at a time t4, the pseudo SRAM is transferred from the stand-by-state into the active state. At a time t5, the chip select signal is risen or activated, followed by the transition of the external address Add. The row enable generating circuit 8 detects this transition and outputs the signal LT. Subsequently, the boost operation of the boost voltage Vbt is made in the same manner as described above.

In accordance with the circuit shown in FIG. 7, when the signal LT is risen, the latch signal La becomes high level "H", whereby the n-channel MOS field effect transistors 14, 17 and 24 turn ON, and the series circuit of the resistances 12 and 13 and the current mirror differential amplifiers 20 and 27 are made active. The series circuit of the resistances 12 and 13 and the current mirror differential amplifiers 20 and 27 have respective current flows i3, i1 and i2. When the boost voltage Vbt is increased to the reference voltage vref2, the latch signal La becomes low level "L", whereby the n-channel MOS field effect transistors 14, 17 and 24 turn OFF. The respective current flows i3, i1 and i2 to the series circuit of the resistances 12 and 13 and the current mirror differential amplifiers 20 and 27 are discontinued.

As described above, in accordance with the first embodiment, when any access is made to the memory cell array 2 or when the power is applied or the refresh operation is made in the stand-by-state or in the active state or when the write/read operation is made in the active state, respective parts of the voltage level control circuit 10 are made active. Except for those timings, the respective parts of the voltage level control circuit 10 are made inactive in order to reduce the power to be consumed by the voltage level control circuit 10.

In accordance with the general DRAM, the refresh timing is controlled by the system, and thus any irregular refresh timings are generated, whereby a long time interval may be present between the refresh operations. At this time, if the power of the voltage level control circuit is made OFF, it is possible that a discharge causes the word voltage level to become lower than a lower limit of the voltage level which ensures he data hold. Namely, it is necessary for DRAM to boost the voltage always in order to keep the word voltage level, for which reason it is necessary that the voltage level control circuit is always kept power-ON-state.

In contrast to this, in accordance with the above-described pseudo SRAM, the refresh operation is invisible from the exterior of the device. The regular refresh timing is automatically generated in the interior of the device. In this case, the next refresh timing is generated within a time period which ensures the data hold. Namely, even if the voltage level control circuit 10 is placed into the power-off-state, the word voltage level is not dropped to such a low level as to allow data to be broken. Accordingly, it may be obtained to both ensure the data hold and reduce the current to be consumed.

Figure 10:
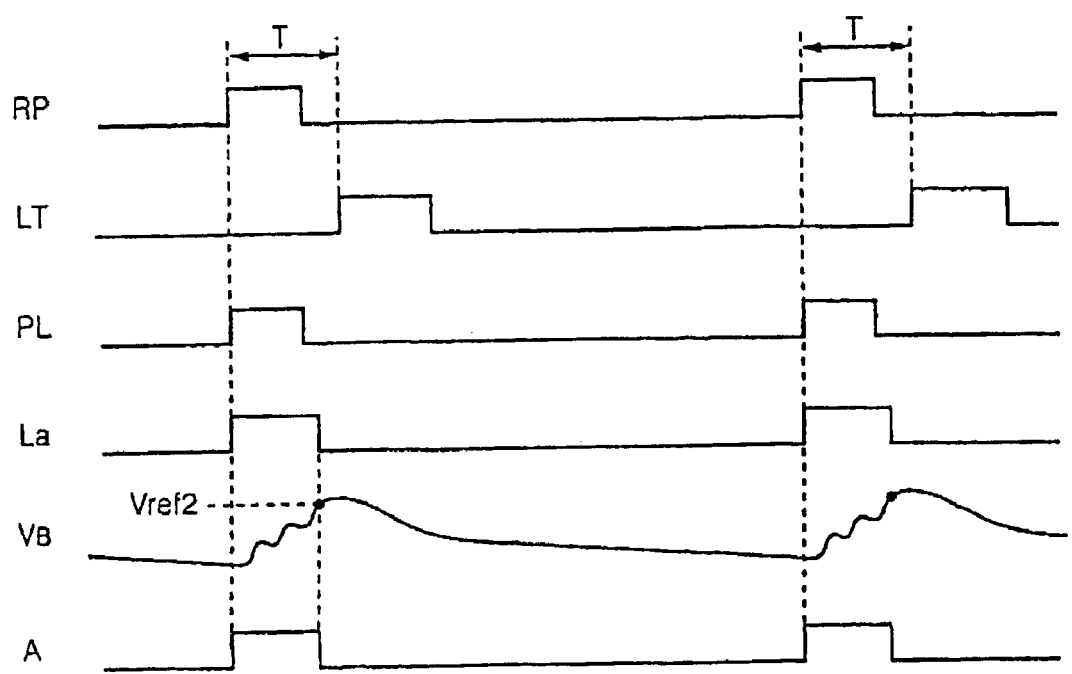
FIG. 10 is a timing chart describing operations of a voltage level control circuit in a second embodiment of the present invention.

A second embodiment of the present invention will be described with reference to FIG. 10. This embodiment is different from the first embodiment in view that as shown in FIG. 10, the row enable generating circuit 8 generates a pulse signal RP which is risen at a timing prior to the timing of rising the signal LT by a predetermined time T, and instead of the signal LT, the pulse signal RP is supplied to the OR-gate 9. In this case, the reference voltage Vref1 is set at the high level. In accordance with this configuration, the pulse signal RP is risen and thus the signal PL is risen, whereby the output La from the latch circuit 11 is risen to place the voltage level control circuit 10 into the active state and also the signal A is risen to commence the boost of the boost voltage Vbt. When the voltage VB reaches the reference voltage Vref2, then the signal A is fallen and thus the output La from the latch circuit 11 is fallen, whereby the voltage level control circuit 10 is made inactive. Immediately after this timing, the signal LT is risen to make an access to the memory cell array 2. In this case, the boost voltage Vbt has already been boosted up sufficiently, so that it is unnecessary to further boost the boost voltage Vbt during the access thereto.

As described above, in accordance with the second embodiment, the boost voltage Vbt is increased up to the reference voltage Vref2 immediately before the signal LT is risen. This configuration may obtain the same effects as in the first embodiment.

Figure 11:
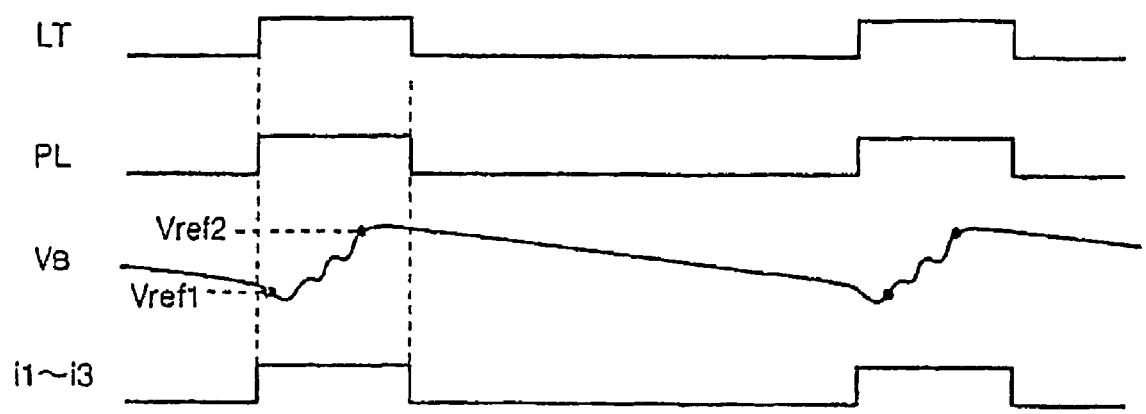
FIG. 11 is a timing chart describing operations of a voltage level control circuit in a third embodiment of the present invention.

A third embodiment of the present invention will be described with reference to FIG. 11. In accordance with this third embodiment, as shown in FIG. 11, a pulse width of the signal LT is set larger slightly than a time necessary for boosting the boost voltage Vbt. The latch circuit 11 shown in FIG. 7 is not provided, while the output from the OR-gate 9 is connected to the node N1 directly. Further, the output from the second inverter 37 is connected to the input of the first inverter. Since, however, the latch circuit 11 is not provide, the output signal from the second inverter 37 is not fed back to the node N1, while the signal PL outputted from the OR-gate 9 is supplied directly to the node N1.

In accordance with this configuration, at the same time when the signal LT is risen, the voltage level circuit 10 is made active, thereby applying the current i1~i3. When the voltage VB becomes lower than the reference voltage Vref1, boosting the boost voltage Vbt is started. When the voltage VB reaches the reference voltage Vref2, boosting the boost voltage Vbt is discontinued. A this time, the voltage level control circuit 10 is never made inactive. Subsequently, when the signal LT is fallen, the currents i1~i3 are not flown, whereby the voltage level control circuit 10 is made inactive.

The active state or the inactive state of the voltage level control circuit 10 is independent from the active state or the inactive state of the output signal A, but is controlled by only the output signal PL from the OR-gate 9. The output signal PL from the OR-gate 9 makes the voltage level control circuit 10 into the inactive state to reduce the power to be consumed by the voltage level control circuit 10.

Figure 12:
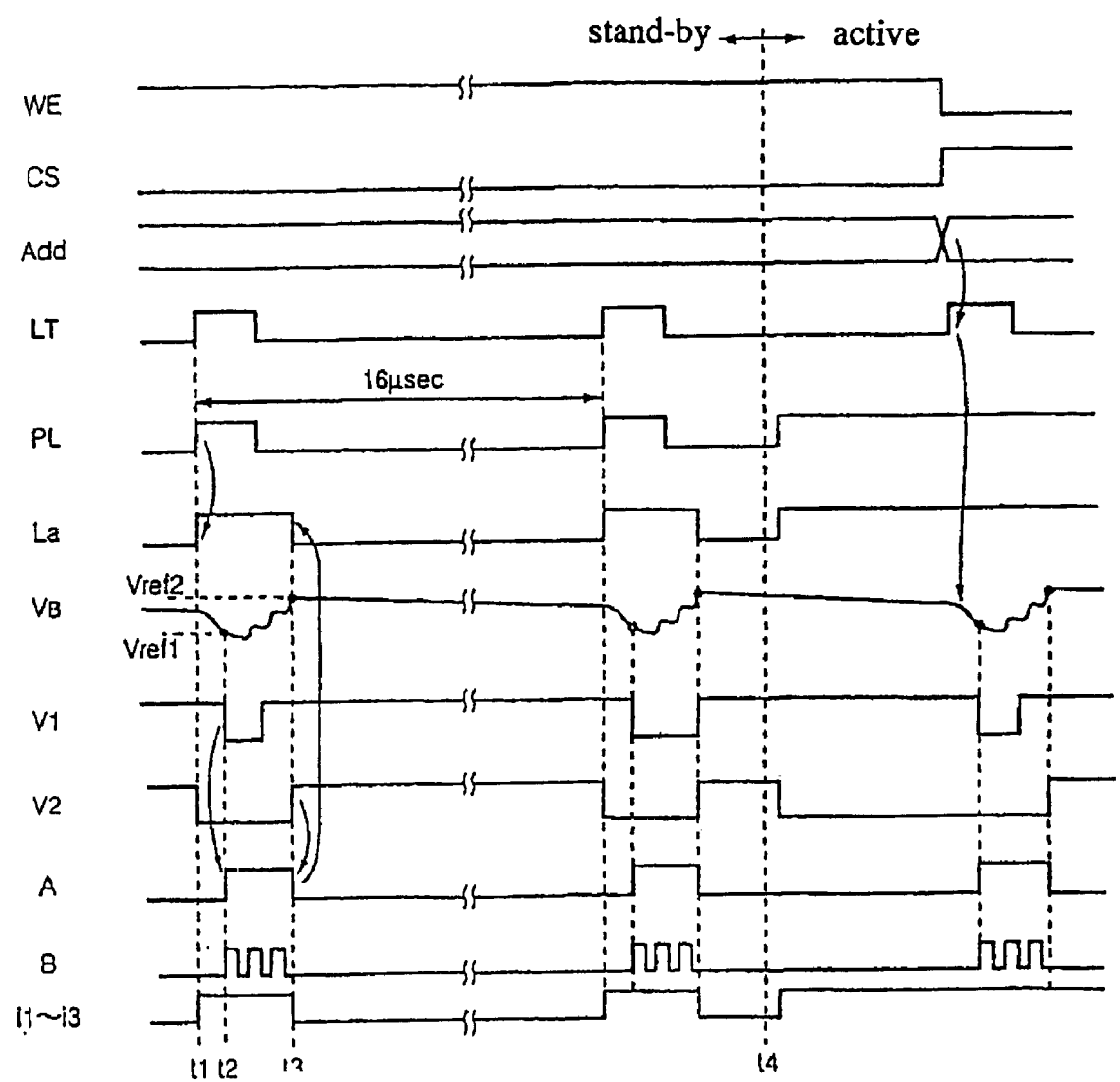
FIG. 12 is a timing chart describing operations of a voltage level control circuit in a fourth embodiment of the present invention.

A fourth embodiment of the present invention will be described with reference to FIG. 12. In this fourth embodiment of the present invention, as shown in FIG. 12, when the device, to which the voltage level control circuit 10 is applied, for example, the pseudo SRAM is in the active state, the output signal PL from the OR-gate 9 is fixed at the high level "H", thereby to fix the output signal La from the latch circuit 11 at the high level "H", so that if the pseudo SRAM is in the active state, then the voltage level control circuit 10 is always maintained in the active state. Operations of the ring oscillator 3 and the boost circuit 4 are controlled based on the voltage level relationship of the boost voltage Vbt with reference to the reference voltages Vref1 and Vref2.

When the pseudo SRAM is made into the inactive state, the signal PL from the OR-gate 9 is released from the fixed high level "H", and the output signal La from the latch circuit 11 is also released from the fixed high level "H". Accordingly, the voltage level control circuit 10 is subjected to the same control as described in the first embodiment. Therefore, when the pseudo SRAM is in the stand-by-state, the power to be consumed by the voltage level control circuit 10 is reduced.

Figure 13:
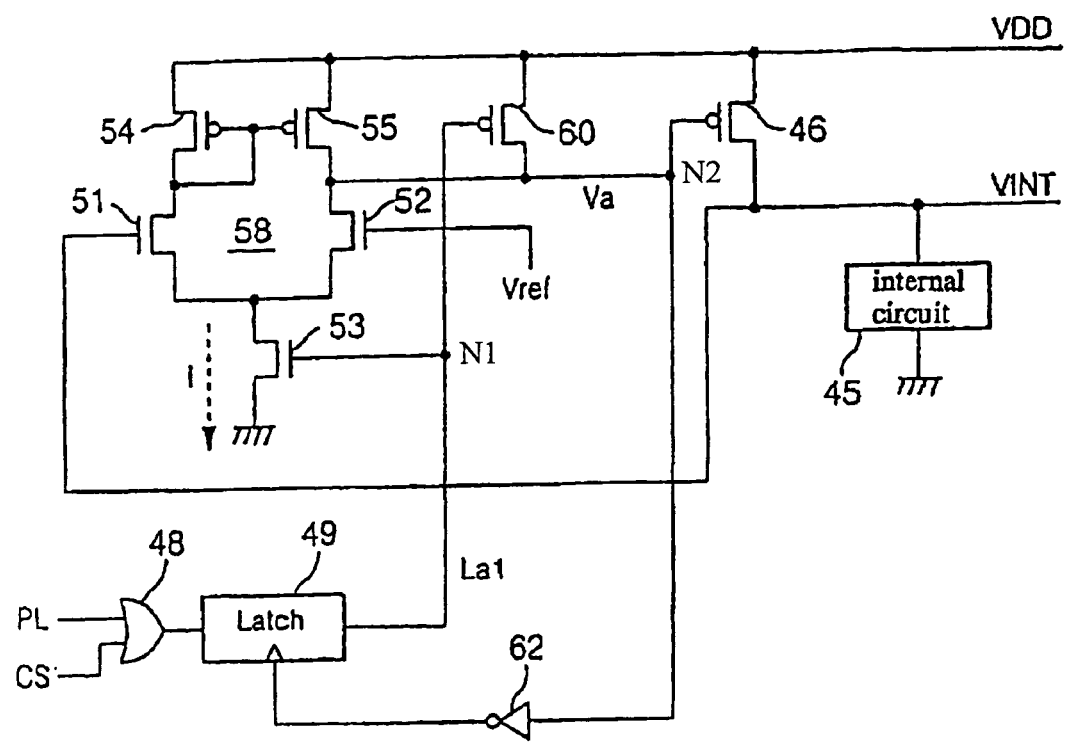
FIG. 13 is a circuit diagram illustrative of a voltage level control circuit in a fifth embodiment of the present invention.

A fifth embodiment of the present invention will be described with reference to FIG. 13. FIG. 13 is a circuit diagram showing the configuration of this embodiment. The circuit illustrated in this embodiment is the internal voltage level control circuit for controlling the voltage level VINT which is to be supplied to an internal circuit 45 such as DRAM or pseudo SRAM. The voltage VINT is a voltage dropped from the power voltage VDD by a p-channel MOS field effect transistor 46. This circuit is usually so called as an internal voltage down circuit.

The circuit in accordance with this embodiment comprises an OR-gate 48, a latch circuit 49, a current mirror differential amplifier 58, first and second switching transistors 46 and 60, a first inverter 62, and an internal circuit supplying an internal voltage level.

A signal PL is inputted into a first input of the OR-gate 48. This signal PL is the same signal as the signal PL shown in FIG. 8, and which is an logical-OR signal of the power-on-reset signal POR and the signal LT. A signal CS is a chip select signal. An input of the latch circuit 49 is connected to an output of the OR-gate 48 for receiving an input of a logical OR signal outputted from the OR-gate 48. A control terminal of the latch circuit 49 is connected to an output of the inverter 62 for receiving an output signal from the inverter 62. When the output signal from the inverter 62 is in the high level "H", then the latch circuit 49 latches the logical OR signal as inputted. When the output signal from the inverter 62 is in the high level "H", then the latch circuit 49 allows the inputted logical OR signal to pass through.

The current mirror differential amplifier 58 comprises three n-channel MOS field effect transistors 51, 52 an 53 and two p-channel MOS field effect transistors 54 and 55. The two n-channel MOS field effect transistors 51 and 53 and the single p-channel MOS field effect transistor 54 are connected in series between the power voltage VDD as the external voltage and the ground line. The two n-channel MOS field effect transistors 52 and 53 and the single p-channel MOS field effect transistor 55 are also connected in series between the power voltage VDD as the external voltage and the ground line.

A gate electrode of the n-channel MOS field effect transistor 51 is connected to the internal voltage VINT or being applied with the internal voltage VINT. A gate electrode of the n-channel MOS field effect transistor 53 is connected to node N1 for being applied with a latch signal La1 outputted from the latch circuit. Gate electrodes of the p-channel MOS field effect transistors 54 and 55 are connected to each other and also connected to a drain of the n-channel MOS field effect transistor 51. A gate electrode of the n-channel MOS field effect transistor 52 is applied with a reference voltage Vref. A drain of the n-channel MOS field effect transistor 52 is connected to an output of the current mirror differential amplifier 58, 50 that a drain voltage of the n-channel MOS field effect transistor 52 appears as an output voltage Va on the output of the current mirror differential amplifier 58.

The first and second switching transistors 46 and 60 comprise p-channel MOS field effect transistors. The second switching transistor 60 is connected between the power voltage VDD and the node N2. A gate electrode of the second switching transistor 60 is connected to the node N1 for being applied with the latch signal La1 outputted from the latch circuit 49. The first switching transistor 46 is connected between the power voltage VDD and the internal voltage VINT to form a voltage down circuit which makes level down the internal voltage VINT from the power voltage VDD. A gate electrode of the first switching transistor 46 is connected through the node N2 to the output of the current mirror differential amplifier 58. The gate electrode of the first switching transistor 46 is connected through the inverter 62 to the control terminal of the latch circuit 49.

The first switching transistor 46 forming the voltage down circuit is controlled in its active or inactive state by the output signal Va from the current mirror differential amplifier 58.

When the latch signal La1 outputted from the latch circuit 49 is in the high level "H", the current mirror differential amplifier 58 is in the active state, and the node N2 connected to the output of the current mirror differential amplifier 58 is isolated or disconnected from the power voltage VDD, so that the output signal Va from the current mirror differential amplifier 58 is applied to the gate electrode of the first switching transistor 46 which forms the voltage down circuit and also is applied through the inverter 62 to the control terminal of the latch circuit 49.

When the first switching transistor 46 which forms the voltage down circuit is in the ON-state or when the voltage down circuit is in the active state, the output signal Va from the current mirror differential amplifier 58 is in the low level "L". This low level is thus inverted by the inverter 62 into the high level "H" which is then applied to the control terminal of the latch circuit 49. The output signal La1 from the latch circuit 49 becomes high level "H" whereby the current mirror differential amplifier 58 is made active. Namely when the voltage down circuit is in the active state, then the current mirror differential amplifier 58 is also in the active state.

When the first switching transistor 46 which forms the voltage down circuit is in the OFF-state, or when the voltage down circuit is in the inactive state, the output signal Va from the current mirror differential amplifier 58 is in the high level "H". This high level is thus inverted by the inverter 62 into the low level "L" which is then applied to the control terminal of the latch circuit 49. The output signal La1 from the latch circuit 49 allows the logical OR signal from the OR-gate 48 to pass through and to be supplied to the node N1. Namely, when the logical OR signal is high level "H", then the current mirror differential amplifier 58 is in the active state. When the logical OR signal is low level "L", then the current mirror differential amplifier 58 is the inactive state. Consequently, if the voltage down circuit is in the inactive state, then the active or inactive state of the current mirror differential amplifier 58 is controlled by the logical OR signal from the OR-gate 48. If the logical OR signal is low level "L", then the current mirror differential amplifier 58 is in the inactive state, thereby reducing the power consumption by the circuit.

Figure 14:
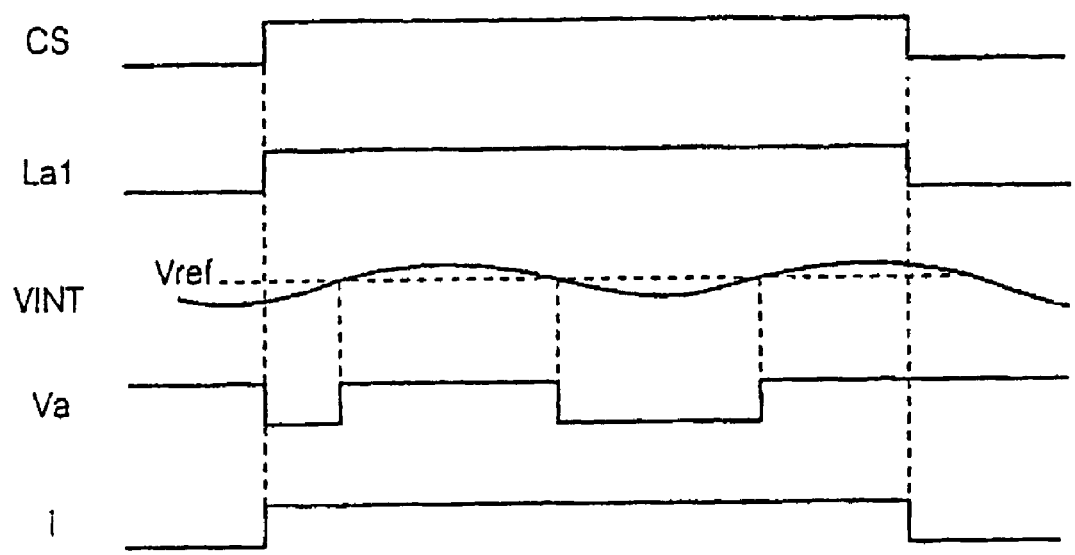
FIG. 14 is a timing chart describing operations in this embodiment.

Operations of the voltage level control circuit of the above circuit configuration will be described with reference to FIG. 14.

In the initial state, the output signal La1 from the latch circuit 49 is low level "L", whereby the n-channel MOS field effect transistor 53 turns OFF, while the p-channel MOS field effect transistor 60 turns ON. Placing the n-channel MOS field effect transistor 53 into the OFF-state makes the current mirror differential amplifier 58 into the inactive state. Placing the p-channel MOS field effect transistor 60 into the ON-state makes the p-channel MOS field effect transistor 46 turns OFF, whereby no voltage is supplied to the internal circuit 45.

When the signal PL becomes high level "H" or the chip select signal CS becomes high level "H", the output signal La1 from the latch circuit 49 becomes high level "H". The signal La1 being high level "H" makes the n-channel MOS field effect transistor 53 into the ON-state, whereby the current mirror differential amplifier 58 is made into the active state. The signal La1 being high level "H" makes the p-channel MOS field effect transistor 60 into the OFF-state, whereby the voltage Va is dropped, and the output from the inverter 62 becomes high level "H". As a result, the output of the high level "H" from the OR-gate 48 is latched by the latch circuit 49.

Subsequently, the current mirror differential amplifier 58 compares the voltage VINT with the reference voltage Vref, so that the p-channel MOS field effect transistor 46 is controlled based on the comparison result. If the voltage VINT becomes lower than the reference voltage Vref, then voltage Va becomes also lower, thereby making the p-channel MOS field effect transistor 46 turn ON to start charging the output with supplying a current to the internal circuit 45. When the charge up to the voltage level is made and the voltage VINT becomes higher than the reference voltage Vref, then voltage Va becomes also increased, thereby making the p-channel MOS field effect transistor 46 turn OFF, and the charge is discontinued. When the voltage Va becomes increased higher than the predetermined voltage level, the output from the inverter 62 becomes low level "L", whereby the latch circuit 49 is made into the through state. As a result, when the signal LT becomes low level "L" or the chip select signal CS becomes low level "L" the signal La becomes low level "L", whereby the n-channel MOS field effect transistor 53 turns OFF, while the p-channel MOS field effect transistor 60 turns ON.

As described above in accordance with the fifth embodiment, if the signal LT or the chip select signal CS becomes low level "L" after the voltage VINT has become larger than the reference voltage Vref, then the n-channel MOS field effect transistor 53 turns OFF, whereby the current "i" flowing through the current mirror differential amplifier 58 becomes zero, resulting in reduction of the circuit power consumption.

In accordance with the above-described first through fifth embodiments, the present inventions are applied to the boost circuit or the internal voltage down circuit for the pseudo SRAM or DRAM. Notwithstanding the present invention is also applicable to a substrate voltage level generating circuit or a substrate back bias generating circuit (BBG circuit).

Figure 15:
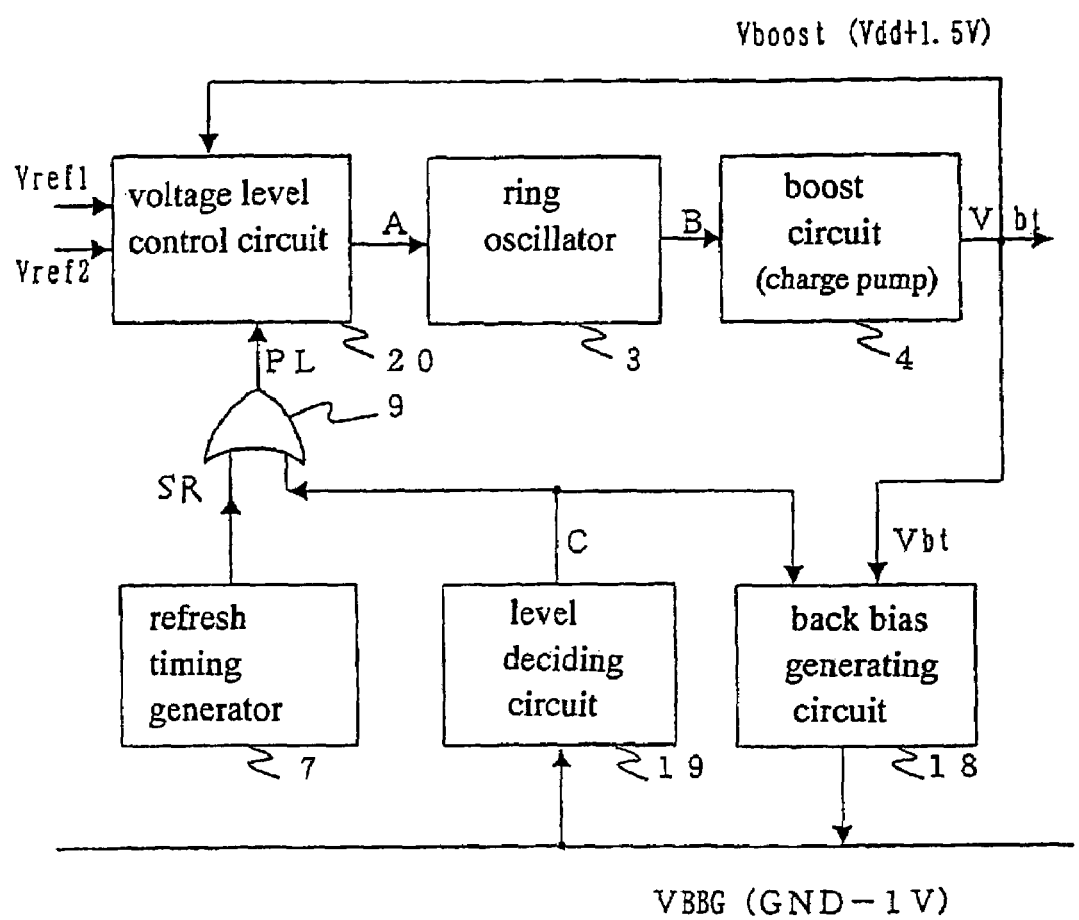
FIG. 15 is a block diagram of a circuit configuration of a voltage level control circuit to be used together with a back-bias generating circuit in a sixth embodiment of the present invention.

A sixth embodiment of the present invention will be described with reference to FIG. 15, which is a diagram showing one example of the circuit configuration of the present invention when applied to the substrate back bias generating circuit (BBG circuit).

The substrate back bias generating circuit is a circuit for generating an internal reference voltage which is lower than a ground level, for example, −1V, by using a potential difference between the external power voltage VDD and the ground level (GND).

The circuit of the present invention has a voltage level control circuit 20, a ring oscillator 3, boost circuit 4, a refresh timing generating circuit 7, a back bias generating circuit 18, a level deciding circuit 19 and an OR-gate 9. The OR-gate 9 is provided for activating respective circuit elements of the voltage level control circuit 20 in refresh operation and in activation operation of the back bias generating circuit 18.

The voltage level control circuit 20 generates, based on the first and second reference voltage Vref1 and Vref2, an internal voltage level control signal A which controls the level of the boost voltage Vbt as an internal voltage. An input side of the ring oscillator 3 is connected to an output side of the voltage level control circuit 20, so that the internal voltage level control signal A is inputted into the ring oscillator 3. The ring oscillator 3 is an oscillating circuit and may comprise a series connection in ring-shape of odd number inverters. If the internal voltage level control signal A outputted from the voltage level control circuit 20 is "H" (high level), then the ring oscillator 3 is activated to output an oscillation output B.

An input side of the boost circuit 4 is connected to an output side of the ring oscillator 3 so that the oscillation output B is inputted into the boost circuit 4. The boost circuit 4 may comprise a charge pump circuit. The boost circuit 4 utilizes the output B from the ring oscillator 3 and boosts a power voltage VDD up by step-by-step and outputs a boost voltage Vbt as the internal voltage.

In case that this circuit is applied to the pseudo SRAM, an output side of the boost circuit 4 is connected to the word decoder 5 of the pseudo SRAM, so that the boost voltage Vbt is inputted into the word decoder. In this case, the boost voltage Vbt is higher than the power voltage VDD, for example, (VDD+1.5V) or (VDD+2V). The output side of the boost circuit 4 is also fed back to the voltage level control circuit 20.

The refresh timing generating circuit 7 generates, at a constant time interval, a refresh signal for refreshing memory cells in the memory cell array 2 and a refresh address for designating an address of the memory cell to be refreshed. This constant time interval is decided within a time period for ensuring data to be held. The time interval for generating the refresh signal is not always constant, provided that the time interval is within the time period for ensuring data to be held. An output side of the refresh timing generating circuit 7 is connected to a first input of the OR-gate 9 so that the refresh signal SR is inputted into the first input.

The back bias generating circuit 18 has first and second inputs. The first input is connected to an output of the boost circuit 4 for receiving an input of the boost voltage Vbt, so that the boost voltage Vbt is utilized to generate a back bias voltage VBBG which is lower than the ground level. The back bias voltage VBBG may, for example be GND−1V. An output of the back bias generating circuit 18 is connected to a region, to which the back bias voltage VBBG is intended to be applied, for example, the semiconductor substrate, so that the semiconductor substrate has the back bias voltage VBBG which is lower than the ground level.

An input of the level deciding circuit 19 is connected to a region connected to an output of the back bias generating circuit 18, for example, the semiconductor substrate, for detecting a potential of the semiconductor substrate. An output of the level deciding circuit 19 is connected to a second input of the back bias generating circuit 18. An output of the level deciding circuit 19 is connected to a second input of the OR-gate 9.

The potential of the semiconductor substrate is the back bias voltage VBBG which is lower than the ground level, for which reason the potential may vary over time due to a leakage. Namely, the potential of the semiconductor substrate is gradually increased. Thus, the level deciding circuit 19 is activated at a constant time interval for detecting the potential of the semiconductor substrate. If the potential becomes above an upper limit of a predetermined allowable potential range, which is lower than the ground level, then a decided result C is inputted into the back bias generating circuit 18, so that the back bias generating circuit 18 drops the potential of the semiconductor substrate. This decided result C is also inputted into the second input of the OR-gate 9, so that the OR-gate 9 takes a logical OR of the decided result C from the level deciding circuit 19 and the refresh signal from the refresh timing generating circuit 7, and then outputs a logical OR signal PL as a result, which is then inputted into the voltage level control circuit 20.

Accordingly, when the refresh operation is necessary or when the activation of the back bias generating circuit 18 is necessary, then the voltage level control circuit 20 is activated, wherein the voltage level control circuit 20 consumes the power. When the device is in the stand-by state and no refresh operation is made and the back bias generating circuit is in the inactive state, then the voltage level control circuit 20 is in the inactive state, thereby suppressing the power consumption by the voltage level control circuit 20.

The circuit configuration disclosed in FIG. 7 may be applied to the voltage level control circuit 20. Only when the power is applied, the read/write operation is made or the refresh operation is made to the device in the active state or the stand-by state, then the boost circuit 4 is made active. Except for those states, or when the refresh operation is not made in the stand-by state, the boost circuit 4 is made inactive. This operation is as described above.

Any known circuit configuration may be applied to the level deciding circuit 19.

Figure 16:
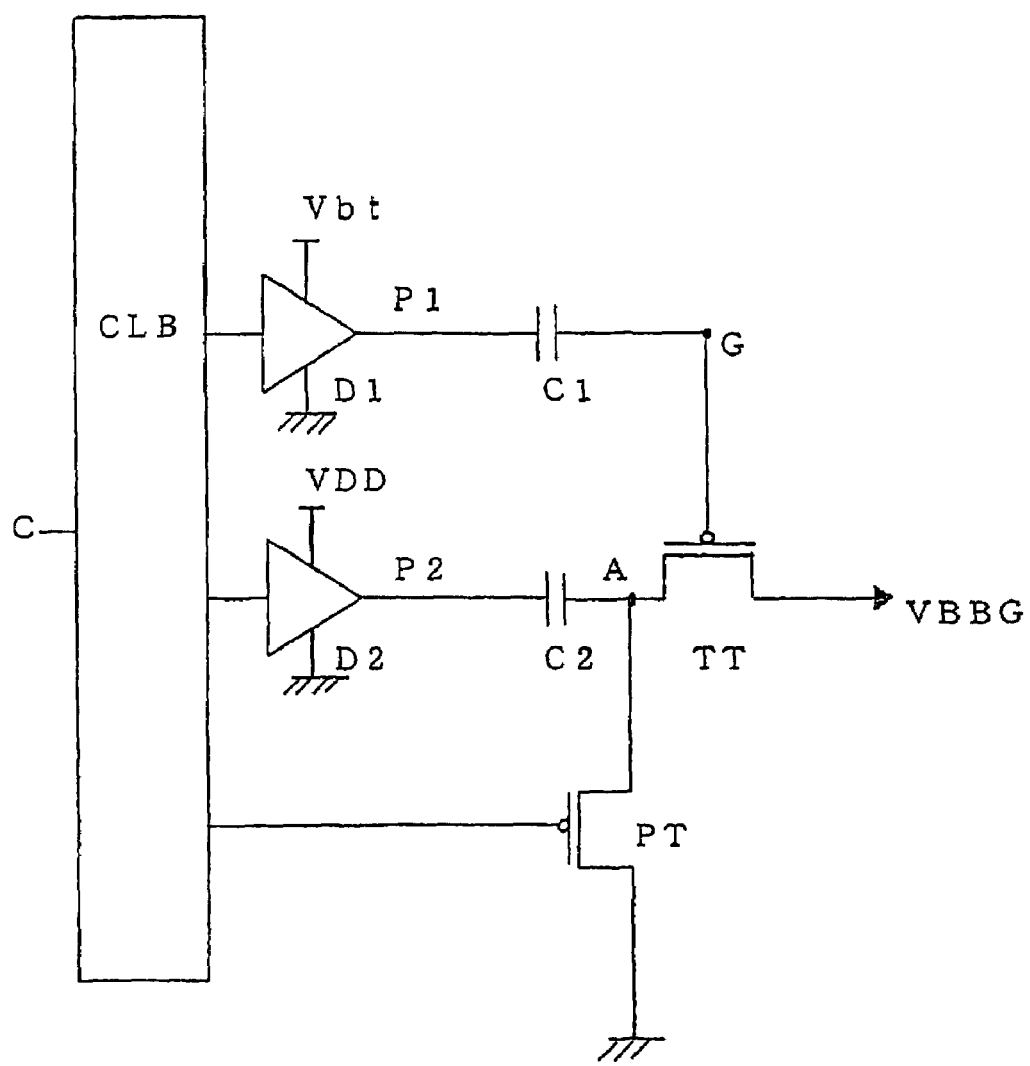
FIG. 16 is a circuit diagram of a back-bias generating circuit to be used for the voltage level control circuit in the sixth embodiment of the present invention.

The back bias generating circuit 18 may, for example, be realized by the circuit configuration shown in FIG. 16, even it is not necessary to limit this circuit configuration.

The back bias generating circuit 18 is so structured that the circuit for driving the gate of the transfer transistor is driven by the boost voltage. For example, the back bias generating circuit 18 may comprise a pre-charge transistor PT, a transfer transistor TT, a control logic block CLB, a first current path P1 comprising a first output driving circuit D1 and a first capacitance C1, and a second current path P2 comprising a second output driving circuit D2 and a second capacitance C2.

The transfer transistor TT may comprise a p-channel MOS field effect transistor. The transfer transistor TT is connected in series between the second current path P2 and the output of the back bias generating circuit 18. A gate of the transfer transistor TT is connected through the first current path P1 to the control logic block CLB. ON-OFF operation of the transfer transistor TT is controlled by a potential appearing on a node G.

The pre-charge transistor PT may comprises a p-channel MOS field effect transistor. The pre-charge transistor PT is connected between the ground and a node A. The node A is a contact point between the second current path P2 and the transfer transistor TT. A gate of the pre-charge transistor PT is connected to the control logic block CLB.

The first output driving circuit D1 is connected to the boost circuit and driven by the boost voltage. The second output driving circuit D2 is driven by the power voltage VDD. It is possible that the second output driving circuit D2 is driven by the boost voltage Vbt instead of the power voltage VDD. Any design change may be possible, provided that the driving voltage for driving the first output driving circuit D1 is higher than the power voltage VDD, and the driving voltage for driving the second output driving circuit D2 is not higher than the driving voltage for driving the first output driving circuit D1.

In case that the power voltage VDD is set low as the low power voltage, for example, about 1.8V the operations of the back bias generating circuit 18 will be described below.

The node A is pre-charged to the ground level or 0V by the pre-charge transistor PT. Subsequently, the second output driving circuit D2 is driven to cause the potential of the node A to be dropped to a minus potential, for example, about −1.8V by the second capacitance C2. At this time, the potential of the node G remains high level, and thus the transfer transistor TT is in the OFF-state.

The potential of the node G is dropped to make the transfer transistor TT turn ON, whereby negative load the node A is transferred through the transfer transistor TT to the output VBBG of the back bias generating circuit 18.

Namely, the potential of the output VBBG is fallen to the minus potential. For transferring the negative charge to the output VBBG, it is important that the transfer transistor is placed into the full ON-state.

If the transfer transistor is not placed into the full ON-state, the negative charge of the node A is not sufficiently transferred to the output VBBG. In case of the low power voltage, the performance of the transfer transistor TT in the ON-state is low and the above problem is caused. This problem is generated in case that the first output driving circuit D1 and the first capacitance C1 are driven by the low power voltage of about 1.8V whereby the potential of the node G is dropped.

As described above, a however, the first output driving circuit D1 and the first capacitance C1 are driven by the boost voltage to ensure the high performance of the transfer transistor TT in the ON-state. Namely, the transfer transistor TT is placed into the full ON-state, whereby the negative charge of the node A is sufficiently transferred to the output VBBG. For example, the boost circuit boosts the low power voltage VDD=1.8V up by 1.7V to generate a boost voltage of 3.5V which is used for driving the first output driving circuit D1 and the first capacitance C1, whereby the potential of the node G is dropped to a low potential close to −3.5V.

The circuit for driving the gate of the transfer transistor TT is driven by the boost voltage to ensure the high performance of the transfer transistor in the ON-state and the normal operation of the back bias generating circuit 18 can be ensured.

A cycle or time period of the refresh operation is much shorter or different in the order or digit from a time interval defined between after the potential of the semiconductor substrate is dropped to the back bias voltage VBBG by the back bias generating circuit 18 and until the potential of the semiconductor substrate becomes above the upper limit of the allowable potential range of the back bias voltage VBBG which is lower than the ground level.

A time period when the deciding circuit 19 is in the active state and a time period when the boost circuit 4 is in the active state are much shorter and different in the order or digit from the time period or cycle of the refresh operation.

The increase of the substrate current flowing through the substrate due to application of the present circuit configuration is close to zero and is so low as ignorable.

Whereas the foregoing embodiments are related to the semiconductor memory devices, the present invention is also applicable to a variety of electronic circuit which generates an internal voltage from the external voltage and controls the internal voltage.

The present invention is not limited to the foregoing embodiments but a variety of modification to the present invention may be available in the context of the subject matter of the present invention.

INDUSTRIAL APPLICABILITY

As described above, in accordance with the present invention, the voltage level control circuit, which detects and controls the internal voltage level generated from the external power voltage, is activated only in case of need, and is inactivated in case of no need to reduce the power consumption by the voltage level control circuit.

The present invention is capable of reducing the power consumption as compared to the conventional semiconductor memory device, for which reason the present invention is suitable for the pseudo SRAM.

Namely, in the semiconductor memory device which performs the active refresh operation without control under the system side, the power consumption by the voltage level control circuit in the stand-by-state, where the refresh operation only is made, can be saved. The present invention is suitable for the semiconductor memory device performing the internal refresh operation such as the pseudo SRAM.

The invention claimed is:

1. A semiconductor memory device comprising a pseudo SRAM which includes an internal generator for automatically generating refresh signals which refresh memory cells at regular refresh timings, said semiconductor memory device including:
a voltage level control circuit for generating a control signal which controls a level of a voltage which drives a word line, and said voltage level control circuit further including:
a first differential amplifier outputting said control signal, which causes a through current flowing through said first differential amplifier to be cut off to inhibit said first differential amplifier from performing a differential amplification operation when a refresh signal is in a first state, and wherein said through current is allowed to enable said first differential amplifier to perform said differential amplifier operation when said refresh signal is in a second state.

2. The semiconductor memory device as claimed in claim 1, wherein said refresh signal is placed in said second state at any time when a power is supplied to said semiconductor memory device, when a refresh is made under a stand-by state of said semiconductor memory device, when another refresh is made under an activated state of said semiconductor memory device or when write/read operations are performed under said activated state, and otherwise said refresh signal is placed in said first state.

3. The semiconductor memory device as claimed in claim 1, further including:
an internal voltage level control circuit for supplying an internal voltage to an internal circuit of said semiconductor memory device, and said internal voltage level control circuit including a second differential amplifier for outputting said internal voltage,
wherein if said refresh signal is in said first state, then a through current flowing through said second differential amplifier is cut off to inhibit said second differential amplifier from performing a differential amplification operation, and
wherein if said refresh signal is in said second state, then said through current flowing through said second differential amplifier is allowed to enable said second differential amplifier to perform said differential amplification operation.

4. The semiconductor memory device as claimed in claim 1, further including:
a boost circuit for outputting a boosted voltage in response to said control signal from said voltage level control circuit; and
a back bias voltage generating circuit for generating a back bias voltage based on said boosted voltage.

5. The semiconductor memory device as claimed in claim 4, wherein said voltage level control circuit further includes a voltage dividing circuit for receiving said boosted voltage and generating divided voltages based on said boosted voltage and for supplying said divided voltages to said first differential amplifier, and
wherein if said refresh signal is in said first state, then a through current flowing through said voltage dividing circuit is cut off, and
wherein if said refresh signal is in said second state, then said through current flowing through said voltage dividing circuit is allowed.

6. A semiconductor memory device comprising a pseudo SRAM which includes memory cells which need refresh, said semiconductor memory device including:
a refresh timing generating circuit for generating a refresh signal which refreshes said memory cells at a predetermined time interval;
a row enable generating circuit for receiving a write enable signal, a chip select signal, an address and said refresh signal, and for generating a row enable signal in response to at least said refresh signal; and
a voltage level control circuit for receiving said row enable signal, and said voltage level control circuit further including a first differential amplifier,
wherein if said row enable signal is in a first state, then a through current flowing through said first differential amplifier is cut off to inhibit said first differential amplifier from performing a differential amplification operation, and
wherein if said row enable signal is in a second state, then said through current is allowed to enable said first differential amplifier to perform said differential amplification operation.

7. The semiconductor memory device as claimed in claim 6, wherein said row enable signal is placed into said second state based on a power-on-reset signal which is activated for a predetermined period of time upon power-on.

8. The semiconductor memory device as claimed in claim 6, further including:
an internal voltage level control circuit for supplying an internal voltage to an internal circuit of said semiconductor memory device, and said internal voltage level control circuit including a second differential amplifier for outputting said internal voltage,
wherein if said row enable signal is in said first state, then a through current flowing through said second differential amplifier is cut off to inhibit said second differential amplifier from performing a differential amplification operation, and
wherein if said row enable signal is in said second state, then said through current flowing through said second differential amplifier is allowed to enable said second differential amplifier to perform said differential amplification operation.

9. The semiconductor memory device as claimed in claim 6, further including:
a boost circuit for outputting a boosted voltage in response to said control signal from said voltage level control circuit; and
a back bias voltage generating circuit for generating a back bias voltage based on said boosted voltage.

10. The semiconductor memory device as claimed in claim 9, wherein said voltage level control circuit further includes a voltage dividing circuit for receiving said boosted voltage and generating divided voltages based on said boosted voltage and for supplying said divided voltages to said first differential amplifier, and
wherein if said refresh signal is in said first state, then a through current flowing through said voltage dividing circuit is cut off, and wherein if said refresh signal is in said second state, then said through current flowing through said voltage dividing circuit is allowed.

11. The semiconductor memory device as claimed in claim 6, wherein said refresh signal is placed in said second state at any time when a power is supplied to said semiconductor memory device, when a refresh is made under a stand-by state of said semiconductor memory device, when another refresh is made under an activated state of said semiconductor memory device or when write/read operations are performed under said activated state, and otherwise said refresh signal is placed in said first state.

12. The semiconductor memory device as claimed in claim 6, further including:
   an internal voltage level control circuit for supplying an internal voltage to an internal circuit of said semiconductor memory device, and said internal voltage level control circuit including a second differential amplifier for outputting said internal voltage,
   wherein if said refresh signal is in said first state, then a through current flowing through said second differential amplifier is cut off to inhibit said second differential amplifier from performing a differential amplification operation, and
   wherein if said refresh signal is in said second state, then said through current flowing through said second differential amplifier is allowed to enable said second differential amplifier to perform said differential amplification operation.

13. The semiconductor memory device as claimed in claim 12, further including:
   a boost circuit for outputting a boosted voltage in response to said control signal from said voltage level control circuit; and
   a back bias voltage generating circuit for generating a back bias voltage based on said boosted voltage.

14. The semiconductor memory device as claimed in claim 13, wherein said voltage level control circuit further includes a voltage dividing circuit for receiving said boosted voltage and generating divided voltages based on said boosted voltage and for supplying said divided voltages to said first differential amplifier, and
   wherein if said refresh signal is in said first state, then a through current flowing through said voltage dividing circuit is cut off, and
   wherein if said refresh signal is in said second state, then said through current flowing through said voltage dividing circuit is allowed.

* * * * *